United States Patent [19]

Schmitt

[11] Patent Number: 4,788,082
[45] Date of Patent: Nov. 29, 1988

[54] METHOD AND APPARATUS FOR THE DEPOSITION OF SOLID FILMS OF A MATERIAL FROM A JET STREAM ENTRAINING THE GASEOUS PHASE OF SAID MATERIAL

[76] Inventor: Jerome J. Schmitt, 265 College St. (12N), New Haven, Conn. 06510

[21] Appl. No.: 888,590

[22] Filed: Dec. 12, 1985

Related U.S. Application Data

[63] Continuation-in-part of Ser. No. 579,676, Feb. 13, 1984, abandoned.

[51] Int. Cl.$^4$ ............................................. C23C 16/00
[52] U.S. Cl. .................... 427/248.1; 427/249; 427/250; 427/255.1; 427/255.2; 427/255.3; 427/255.5; 427/255.6
[58] Field of Search .................. 427/38, 86, 87, 248.1, 427/249, 345, 250, 255.1, 255.3, 255.2, 255.5, 255.6, 255.7; 428/411; 118/715, 666, 724, 725, 729, 730

[56] References Cited

U.S. PATENT DOCUMENTS

| | | | |
|---|---|---|---|
| 2,155,932 | 4/1939 | Davis | 427/255.1 |
| 3,382,845 | 5/1968 | Jester | 427/255.1 |
| 3,654,895 | 4/1972 | Bloom et al. | 118/65 |
| 3,808,035 | 4/1974 | Stelter | 427/255.1 |
| 3,840,391 | 10/1974 | Spitz et al. | 427/248.1 |
| 3,850,679 | 11/1974 | Sopko et al. | 427/255.3 |
| 4,033,286 | 7/1977 | Chern et al. | 427/255.1 |
| 4,351,267 | 9/1982 | Kalbskopf et al. | 118/61 |
| 4,468,283 | 8/1984 | Ahmed | 427/255.1 |

OTHER PUBLICATIONS

Bunshah, "Deposition Technologies–An Overview", Materials Dept. Univ. of California.
Schmitt, "Formation of Thin Solid Films of Hydrogenated Amorphous Silicon Alloys for Use in Solar Energy Conversion".
Konmer, "Inertial Impaction on Cylinders & Surface Reaction", Rice Univ.
de la Mora et al, "Inertial Impaction of Heavy Molecules", Yale Univ., Mech. & Chem. Engineering.

Primary Examiner—Sadie Childs
Attorney, Agent, or Firm—William F. Kilgannon; Daniel H. Steidle

[57] ABSTRACT

Described is a method for depositing from the vapor phase a chemical species into the form of a thin solid film material which overlays a substrate material. The deposition process consists of three steps: (1) synthesis of depositing species, (2) transport of said species from site of synthesis to a prepared substrate material, and (3) condensation and subsequent film growth. The transport step is achieved by admixing small concentrations of the depositing species into the flow of a high speed jet of an inert carrier gas. This jet impinges on the substrate's surface and thereby convects the depositing species to this surface where condensation occurs. Since the gas mixture is at fairly high pressure, the deposition is achieved in a simple flow apparatus rather than in the high vacuum systems required of other methods. Also this transport technique allows the chemical and/or physical phenomena utilized in the depositing species synthesis step to be isolated from the actual condensation reaction. Consequently, the conditions governing each of these reactions can be varied independently to optimize both steps. Such flexibility permits the synthesis and deposition of a wide variety of chemical species, hence many thin film materials are susceptible to formation by this method.

28 Claims, 10 Drawing Sheets

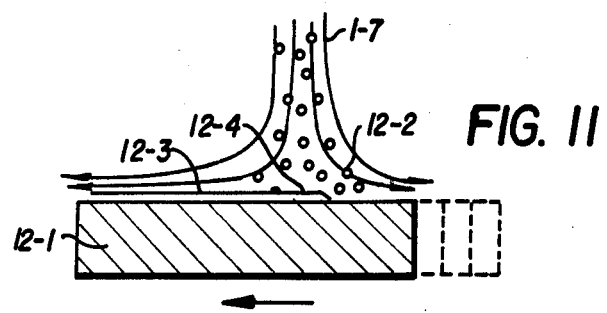
FIG. 11
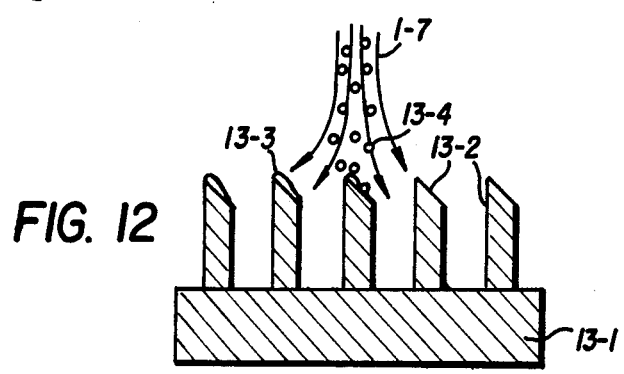
FIG. 12
FIG. 13
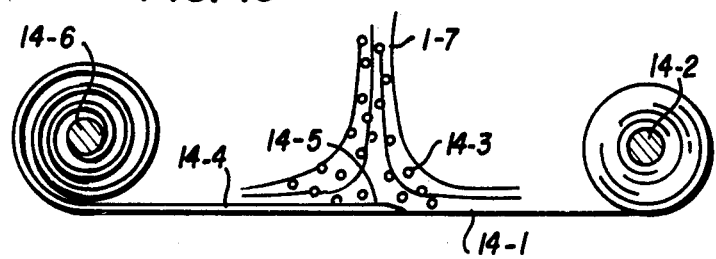

METHOD AND APPARATUS FOR THE DEPOSITION OF SOLID FILMS OF A MATERIAL FROM A JET STREAM ENTRAINING THE GASEOUS PHASE OF SAID MATERIAL

This application is a continuation-in-part of patent application Ser. No. 579,676, filed on Feb. 13, 1984, now abandoned.

FIELD OF THE INVENTION

This invention relates generally to the field of thin solid film coating deposition technologies which are techniques for fabricating materials in the form of a thin solid film coating on a substrate material. In particular, the invention described herein makes possible deposition of both old and new materials under conditions of lower vacuum than required by other technologies. Such coating materials can have unusual and remarkably useful properties, especially in the areas of electronics, optics, wear surfaces, protective coatings, catalytic materials, powder metallurgy, and biomedical implant surface coating.

BACKGROUND OF THE INVENTION

In recent years, in the prior art much effort has been directed toward development of economically viable techniques for manufacturing various useful materials in the form of thin solid films which overlay a supporting solid substrate material, such as corrosion resistant materials, which provide chemical protection for the supporting material (e.g. an oxide coating on an aircraft engine's turbine blades). There are many differing technologies in use today, yet they can all be classified under one of the following five categories:

(1) Physical Vapor Deposition
(2) Chemical Vapor Deposition
(3) Electro—and Electroless Deposition
(4) Thermal Spraying methods
(5) Polymeric Coating methods However, all these diverse methods involve the following three steps: (1) Synthesis of the depositing species; (2) Transport of the depositing species from its source or place of synthesis to the site of deposition; (3) Deposition and subsequent film growth.

It is recognized that in the prior art the same thin film material may be susceptible to formation by several different techniques. For example, thin films of amorphous hydrogenated silicon, which can be used in solar power conversion technology, may be fabricated by three radically different techniques: (1) Plasma deposition; (2) Sputtering and (3) Chemical Vapor Deposition (see e.g. M. H. Brodsky, "Plasma Preperation of Amorphous Silicon Films", *Thin Solid Films* 50, 1978 Elsevier Sequoia S. A., Lausanne—The Netherlands; T. D. Moustakas, et al, "Preparation of Highly Photoconductive Amorphous Silicon by RF Sputtering", *Solid State Communications* 23, 1977 Pergamon Press—Great Britain; S. C. Gau, et al, "Preperation of Amorphous Silicon Films by Chemical Vapor Deposition From Higher Silanes", *Applied Physics Letters* 39 (5), 1981 American Institute of Physics). Often an innovation in deposition technology manifests itself not as a direct improvement in the product material, but rather as an economic improvement in the process technique. It is to an improvement in the process that my inventions of both apparatus and method make possible, for with the use of simple flow systems, deposition of thin film materials are achieved, which previously required methods which employed complicated high vacuum apparatus. The result also makes possible synthesis and deposition of new structures of known chemical species.

SUMMARY OF THE INVENTION

My inventions allow one to produce a useful thin solid film material by depositing from the gas-phase a saturated chemical vapor species onto a substrate material through the use of a high speed jet of inert carrier gas to transport the depositing chemical species—present in dilute concentrations in the carrier gas—from the site where the synthesis of the depositing vapor species occurs to the substrate material where condensation and deposition occurs.

Other objects, advantages, and novel features of my inventions, as well as the need and motivation for using the broad term "useful thin solid material", will without departing from my inventions become apparent to those skilled in the art both now and in the future upon examination of the following detailed description of the preferred embodiments of my inventions, and the accompanying drawings, in which: FIG. (1) depicts a preferred embodiment of an apparatus useful for my invention. There is shown a nozzle 1-1, and a chamber 1-2 downstream of the nozzle 1-1 termed herein the deposition chamber. An inert flowing gas shown as streamlines 1-3 acts as the carrier fluid. A mechanical pump 1-4 induces a steady flow of the inert carrier gas 1-3 from the gas supply 1-5 through the inlet 1-6. The flow proceeds through the nozzle 1-1 into the deposition chamber 1-2, where it forms a jet 1-7. The flow exits via an outlet 1-8. If desired, the carrier gas may be recirculated by a recirculation loop 1-9. Within chamber 1-2 is positioned the substrate 1-10 on which the product thin film 1-11 is deposited. The film thickness is exaggerated for illustration. The nozzle 1-1 and the substrate 1-10 may move relative to one another in order to change the area of the substrate's 1-10 surface which is directly under the nozzle 1-1 and thereby coat a larger portion of that surface. A transport mechanism 1-12 achieves this motion by moving the substrate. (Alternately, the nozzle 1-1 could be mounted on a mechanism which moves it relative to a stationary substrate 1-10. The concept of relative motion to coat a broad area of the substrate surface is amplified in FIG. (11). An apparatus 1-13 for heating and/or cooling the substrate is also depicted, as well as a means 1-14 for heating or cooling the carrier gas before it enters the nozzle 1-1 through the inlet 1-7. A port 1-15 provides access to the deposition chamber 1-2. The regions R1 and R2 of the flowfield, schematically contained within the broken lines of FIG. (1), are significant in the description of the deposition process which follows below.

FIG. (2) depicts a specific example of the preferred method in which a particular material is deposited, in this case: tungstic-oxide. In addition to the general features of the apparatus depicted in FIG. (1)—for which features FIG. (2) has the same illustration numbers—there are also illustrated features necessary for the deposition of tungstic-oxide. The carrier gas depicted as streamlines 1-3 is helium (although any other inert fluid could also be employed). A dilute concentration of oxygen 2-1 (exaggerated oxygen molecules depicted as open circles) which has been premixed in the helium 1-3 contained in the gas supply 1-5 enters through the inlet 1-7. There is shown an tungsten filament 2-2 (which is a solid cylindrical rod oriented transverse to the plane of FIG. (2)). Also illustrated are evaporated tungsten atoms 2-3 (closed circles) and tungstic-oxide radicals 2-4 (connected pairs of open and closed circles). The tungstic-oxide deposit 2-5 is shown being formed on the prepared substrate 1-10. The method for the formation of an tungstic-oxide deposit is described below.

FIG. (3) is an enlargement of an important portion of FIG. (1). That portion is the nozzle exit region of the flowfield, which contains the part of the flow region R1 furthest upstream in the flow (see FIG. (1)). The nozzle walls 3-1 represent the end of the converging part of the nozzle, the nozzle throat, and exit as depicted by 1-1 in FIG. (1). The streamlines 1-3 represent the flow of the inert carrier gas through the nozzle. A saturated chemical-vapor species 3-2 (molecules of which are signified by small circles) originate at some source 3-3 (depicted as a large open circle) centered in the flowfield. The flow of the carrier fluid entrains this condensible molecular species and convects them through the nozzle and beyond the nozzle exit 3-4. The region of the flowfield which contains condensible species is demarcated by broken lines, which region is termed herin region R1.

FIG. (4) illustrates one mechanism for introducing chemical reation precursor species as dilute components in mixture with the flow of the inert carrier fluid. The nozzle 1-1 and inlet 1-6 as well as the inert carrier gas streamlines 1-3 of FIG. (1) are reproduced here. The remainder of the apparatus depicted in FIG. (1) is assumed to be in place, but is not represented in FIG. (4). For this mechanism, an undersaturated vaporous precursor species 4-1 (molecules of which are depicted as open circles) has been premixed in the carrier fluid upstream of the inlet.

FIG. (5) illustrates an additional mechanism for introducing precursor species into the flow of the carrier fluid. Again, the nozzle 1-1, inlet 1-6, and streamlines 1-3 of FIG. (1) are reproduced, but it is assumed that the remaining unrepresented features of the apparatus depicted in FIG. (1) are in place as well—they are just not reproduced here in FIG. (5). In this mechanism, the precursor species is present initially in solid or liquid state. This solid or liquid material 5-1 (represented as a large open circle) is held in place in the flowfield, and is then heated to evaporate (or sublime) molecules 5-2 off into the gas-phase (These molecules are depicted as small open circles). These molecules are entrained in the flow of the carrier gas and convected through the nozzle.

FIG. (6) illustrates another method of precursor species introduction. Again, the nozzle 1-1, inlet 1-6 and streamlines 1-3 of FIG. (1) are reproduced. The remainder of the apparatus shown in FIG. (1) is assumed also to be in place, but is not depicted. In this mechanism, the reactant species 6-1 (molecules of which are depicted as open circles) are in gas or liquid phase, and are introduced via a thin tube 6-2 which exits into the region R1. The reaction precursor species is assumed to originate from a supply source which is not depicted.

FIG. (7) illustrates a nozzle with a diverging section (often termed a Laval nozzle). The flow of the gas is depicted by streamlines 1-3. The flow is accelerated through the converging section 1-1 of the nozzle until it reaches the nozzle throat 8-1, which is the point of greatest constriction. Beyond the throat, the flow is still contained within the diverging section 8-2 (in contrast to a nozzle with exit at the end of the throat). The flow of gas exits at the end of the diverging section and forms a jet 1-7. Such a nozzle would be substituted in the apparatus depicted in FIG. (1) for the nozzle 1-1 which is schematically illustrated in FIG. (1) as having only a converging section.

FIGS. (9), (10) and (11) serve to illustrate the flow of the carrier gas past—and the deposition of the condensing species on—three types of substrates differentiated by their geometries. These substrates would be substituted for the substrate 1-10 of the apparatus in FIG. (1). The only feature of FIG. (1) actually reproduced in these Figures is the carrier gas jet 1-7 which is depicted as streamlines, but the remainder of that apparatus is assumed to be in place—it is merely not depicted. These Figures serve to illustrate the three possible generalized cases of substrate geometry and the consequent effect of these cases on the flow field of the gas mixture and the deposition process.

FIG. (8) shows the flow of the jet 1-7 past a generalized "bluff body" or substrate 9-1 of low or zero curvature. Curvature must be compared to the width of the jet 1-7. The streamlines of the carrier gas jet 1-7 impinge on the surface and then flow along the surface away from the site of impingement termed herein the "stagnation point". The molecules 9-2 of the depositing species are convected by the carrier gas flow to the substrate surface where they condense to form the thin film coating 9-3. The deposit's thickness is exaggerated in this Figure for the purpose of illustration. The deposition is most concentrated at the stagnation point 9-4.

FIG. (9) illustrates the flow field around a "sharp-edged" substrate 10-1, with its edge directed into the flow of the jet 1-7. In this case, the stagnation point 10-4 occurs at the edge itself, and the deposition is concentrated there. Again, the molecules 10-2 of the depositing species condense to form a thin film coating 10-3.

FIG. (10) shows the jet's 1-7 flow past a substrate 11-1 of large curvature. Curvature must be compared to the width of the jet 1-7. In this case, the streamlines of the carrier gas jet 1-7 flow around the substrate 10-1 and rejoin downstream. The molecules 11-2 of the depositing species are convected by the carrier fluid 1-7 to the substrate's 11-1 surface where they deposit to form a thin film coating 11-3. In this case too, there is a stagnation point 11-4 at which the deposition will be most concentrated.

FIG. (11) illustrate the concept of employing the mechanism 1-12 of the apparatus of FIG. (1) to move the substrate 1-10 ralative to the jet 1-7 (or the nozzle 1-1, since the jet is emitted from the nozzle). Alternately, there may be a mechanism that moves the nozzle 1-1 relative to a stationary substrate 1-10. Therefore to illustrate the general notion of substrate motion relative to the jet 1-7, only the jet 1-7 and the substrate 1-10 of FIG. (1) are reproduced here (the substrate 1-10 is relabeled 12-1), although the remainder of the apparatus in FIG. (1) is assumed to be in place here as well. Also, for the purposes of illustration, a "bluff body" substrate as depicted in FIG. (8) is shown here as the substrate 12-1, although a "sharp-edged" substrate (see FIG. (9)) or a substrate with large curvature relative to the jet's 1-7 width (see FIG. (10)) could be substituted for the substrate 12-1 as well. The point FIG. (11) serves to illustrate is that as the substrate 12-1 is moved relative to the jet 1-7, the stagnation point 12-4 of the carrier gas flow—which is also the site where the deposition of the condensing species is most concentrated—moves across the surface of the substrate 12-1. (The direction of substrate 12-1 relative motion to the jet 1-7 is indicated in FIG. (11).) Thus, there is not just one point on the substrate's 12-1 surface where deposition is concentrated, but rather the concentrated deposition occurs across the surface, and if the motion is at a uniform rate (also, of course, assuming the condensing species 12-2 arrive at the stagnation point at a constant rate) then a thin film 12-3 of uniform thickness will condense on the substrate's 12-1 surface.

FIG. (12) shows the use of the apparatus illustrated in FIG. (1) in "batch mode" for the coating of "batches" of substrates. Only the jet 1-7 of FIG. (1) is reproduced in FIG. (12) although the rest of the apparatus of FIG. (1) is assumed to be in place. Substituted for the substrate 1-10 of FIG. (1) is a mechanism 13-1 for holding and transporting individual substrates 13-2 into and through the flow of the jet 1-7 where they recieve their thin film coating 13-3 as the jet 1-7 transports the condensible species 13-4 to the surface of the individual subtrates 13-2. Although the "sharp-edged" substrates of FIG. (9) are depicted as the individual substrates 13-2 in FIG. (11), the other substrate geometries shown in FIGS. (9) and (11) are also possible individual substrates for the "batch mode". All the individual substrates 13-2 are contained in the deposition chamber 1-2 of FIG. (1) (not depicted). After the entire batch of substrates 13-2 are coated, the deposition is complete, and the deposition chamber 1-2 is opened to remove the coated substrates 13-2.

FIG. (13) illustrates the use of the apparatus in FIG. (1) in "semi-continuous" mode of deposition. Only the jet 1-7 of FIG. (1) is reproduced here, although the balance of the apparatus depicted in FIG. (1) is also assumed to be in place. Substituted for the substrate 1-10 of FIG. (1) is the substrate 14-1 in the form of rolled stock (e.g. rolled sheet metal). This rolled stock is unwound from one spool 14-2, passed through the jet 1-7 which transports the condensible species 14-3 to its surface, and receives its thin film coating 14-4 at the stagnation point 14-5. Finally, the coated substrate stock is rewound on another spool 14-6. Both spools are contained within the deposition chamber 1-2 of FIG. (1) (not depicted here). After the rolled stock is coated and rerolled on the receiving spool 14-6, the deposition is complete, so the deposition chamber 1-2 is opened and the coated substrate removed. Both "bluff body" substrates (see FIG. (8))—e.g. rolled sheet metal—or substrates with large curvature (see FIG. (10))—e.g. coiled wire—may be coated with thin film material in the "semi-continuous" mode. Even "sharp-edged" substrates (see FIG. (9)) may be coated in this manner provided they are capable of being rolled or coiled.

FIG. (14) illustrates the use of the apparatus of FIG. (1) for the production of powdered materials as used in metallurgy. Only the jet 1-7 of FIG. (1) is reproduced here, although the entire apparatus depicted in FIG. (1) is assumed to be in place. Substituted for the substrate 1-10 of FIG. (1) is a rotating drum 15-1 (with sides which act as a target surface area where condensation occurs). The jet 1-7 transports the depositing species 15-2 to the surface of the drum 15-1 where deposition occurs at the stagnation point 15-3. As the depositing species 15-2 condenses and forms a thin film coating 15-4 on the rotating drum 15-1, the thin film material 15-4 subsequently revolves around with the drum 15-1, and encounters a scraper 15-5 which removes the material 15-4 from the drum 15-1. This material, in powdered form 15-6, is collected in a hopper 15-7. The entire apparatus in FIG. (14) is contained within the deposition chamber 1-2 of FIG. (1) (not depicted). When the hopper 15-7 is filled with the powder 15-6, the deposition process is discontinued, and the deposition chamber 1-2 is opened to remove the powder for use in powder metallurgy. Also depicted are heating and cooling mechanisms 15-8 for heating and/or cooling the drum surface to facilitate the deposition and powdering processes.

FIG. (15) depicts an alternate embodiment of the apparatus depicted in FIG. (1) which is similar to the arrangement illustrated in FIG. (14). FIG. (15) represents an apparatus which is substituted for the substrate 1-10 of FIG. (1), and is used for the production of thin sheets of material. The only feature of FIG. (1) reproduced here is the jet 1-7, although the remainder of the apparatus is assumed to be in place. The jet 1-7 transports the depositing species 16-2 to the surface of a rotating drum, 16-1 (which acts as a target condensation area) where that species condenses at the stagnation point 16-3 to form a thin film 16-4. The drum 16-1 rotates and the film 16-4 encounters the scraper 16-5 which peels the film off the drum 16-1 so that the material is in the form of a thin sheet 16-7. A mechanism 16-6 pulls and transports the sheet material 16-7 off the drum 16-1. The entire apparatus is contained within the depostion chamber 1-2 of FIG. (1) (not depicted). After fabrication of the sheet material 16-7, the deposition process is complete and the chamber 1-2 is opened so that the sheet stock 16-7 can be removed. Mechanisms 16-8 for heating and/or cooling the drum 16-1 to facilitate the deposition and peeling processes are depicted.

FIG. (16) depicts the experimental apparatus. The gas flow originates in a storage cylinder (not depicted), and enters the apparatus via a pipe through inlet 17-1. The flow is regulated with the needle valve 17-2, and the throttle valve 17-14. The pressure upstream of the small orifice 17-4 is measured by a mercury manometer (not depicted) attached to the flow system at 17-3. The flow pressure upstream of the nozzle 17-10 is measured by an oil manometer (not shown) attached at 17-7. The gas flows through the nozzle 17-10 into the deposition chamber 17-8, which is a glass bell jar. (The cross-hatched components are machined brass.) The lower pressure in the deposition chamber is measured with an oil manometer (not depicted) attached at 17-13. The gas flow forms a jet as it exits the nozzle 1-10, which jet impinges on the substrate 17-11 (usually a microscope slide). The nozzle to substrate distance may be adjusted with the thumbscrew 17-12. A tungsten filament 17-9 is placed just upstream (within one nozzle diameter) of the nozzle throat section (see FIG. (17)). A line-of-sight 17-5 is maintained to the filament 17-9, so that a measurement of its temperature can be taken using an optical pyrometer 17-6. The flow finally exits through the throttle valve 17-14 and is pumped away by a rotary pump (not depicted) attached at 17-15.

FIG. (17) shows the cross-sections of two nozzles used in the experimental demonstrations. Both were of conical symmetry and were made of brass. The dimensions of the throat diameter and length are indicated.

FIG. (18) shows the cross-sections, and throat dimensions of two nozzles used in experiments. These are made of brass.

DETAILED DESCRIPTION OF PREFERRED EMBODIMENTS

Figure 1:
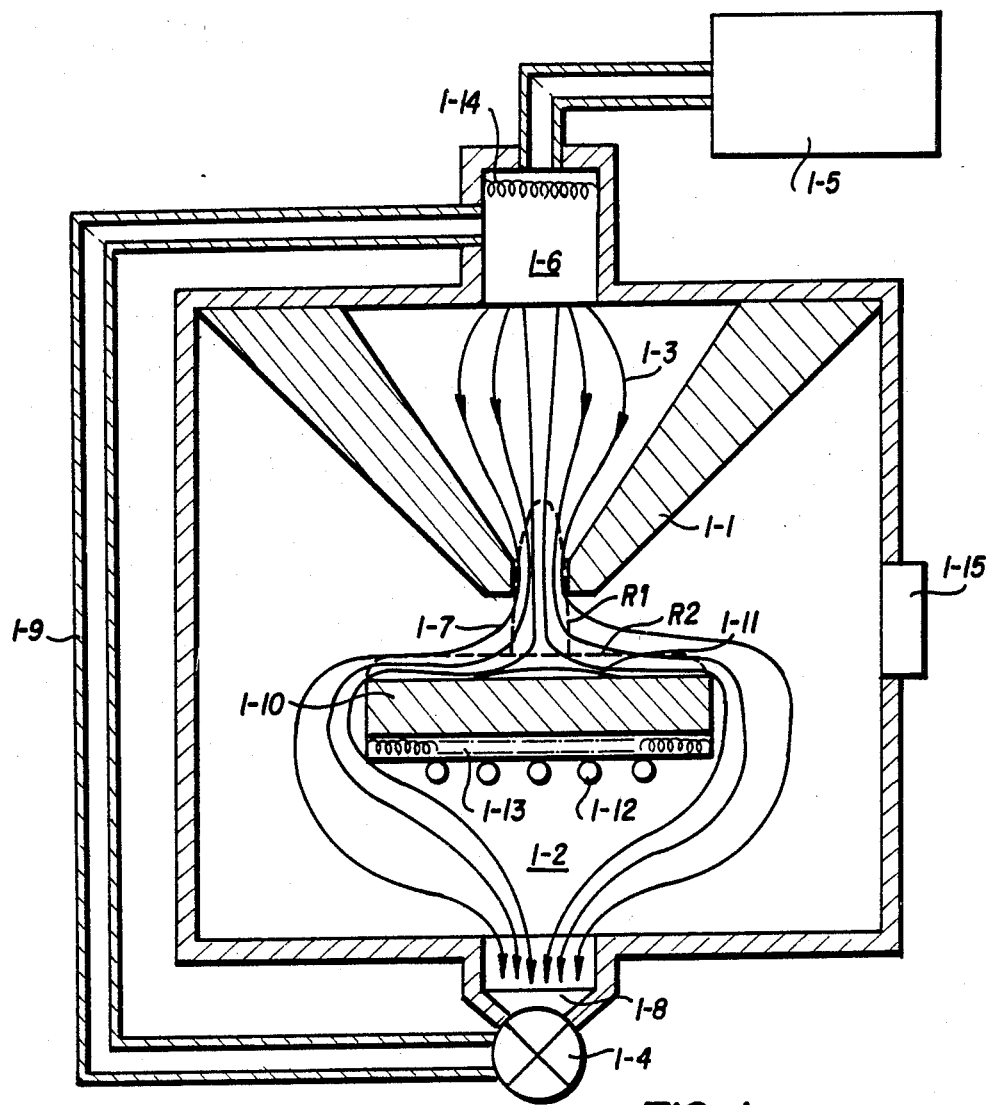
Figure 2:
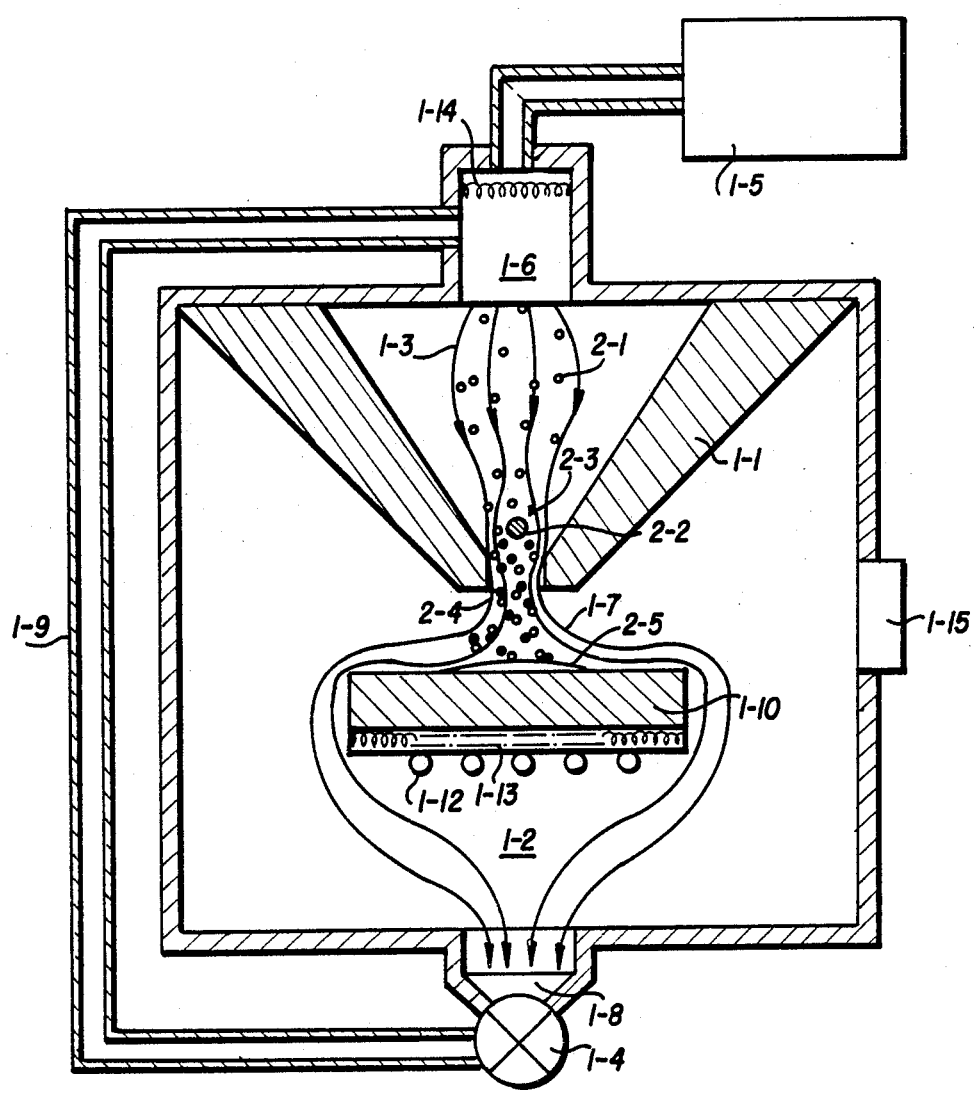
Figure 3:
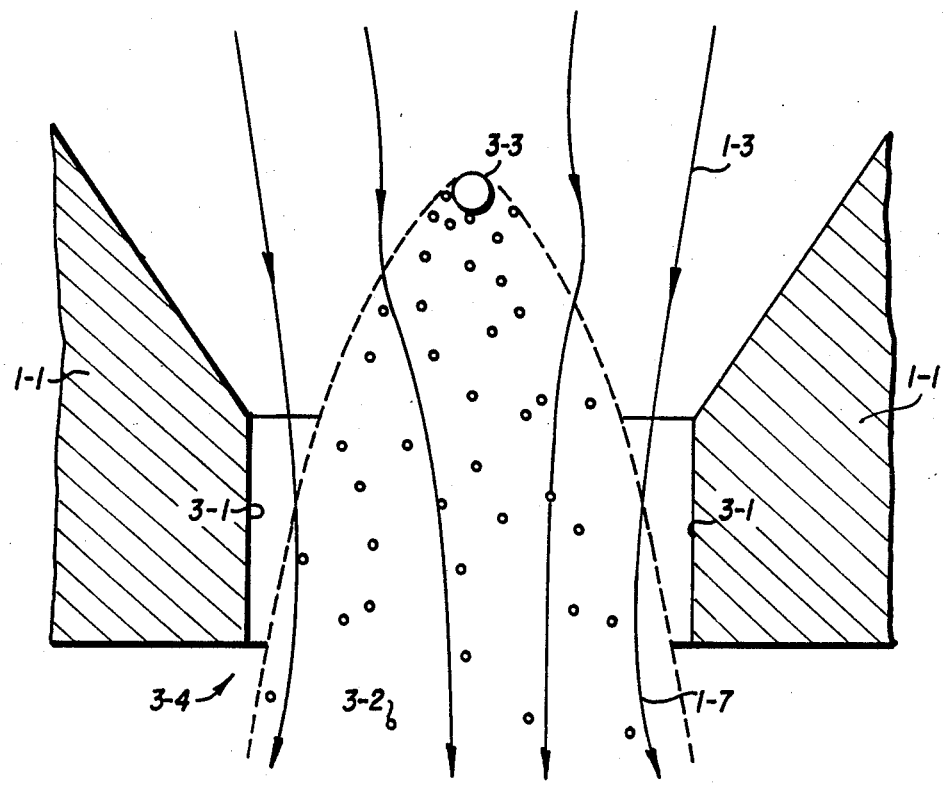
Figure 4:
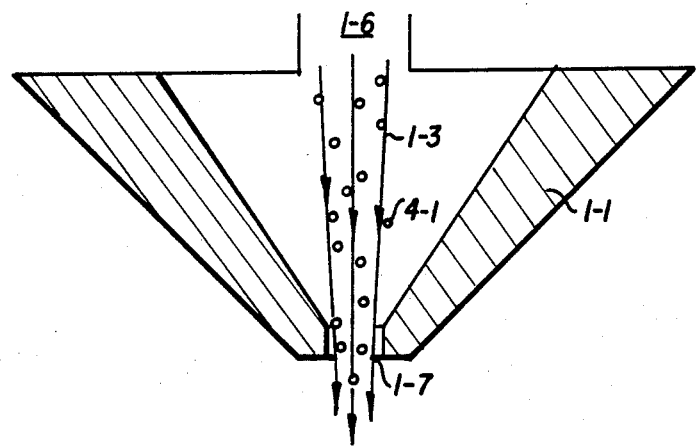
Figure 5:
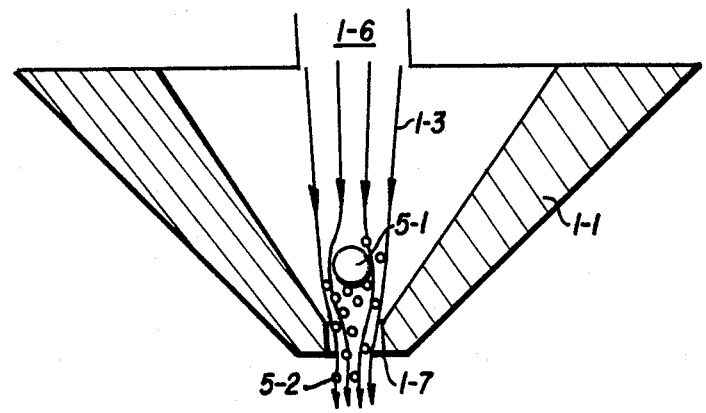
Figure 6:
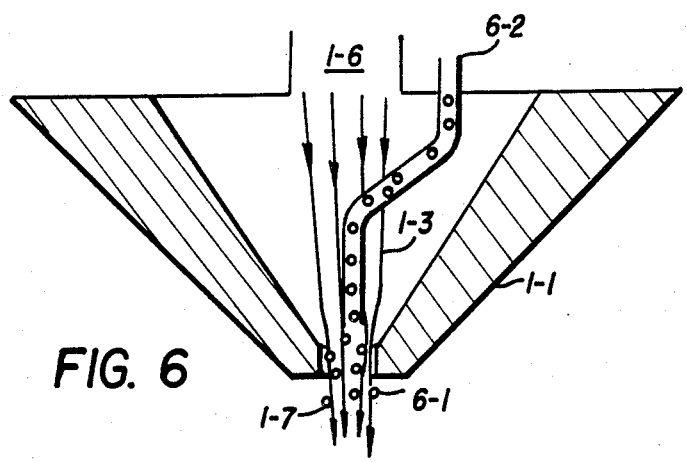
Figure 7:
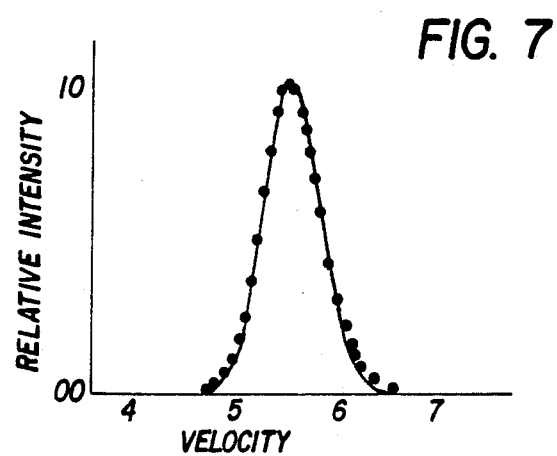
Figure 8:
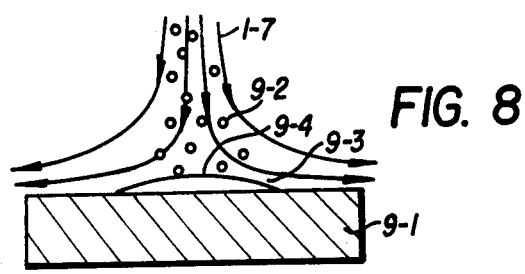
Figure 9:
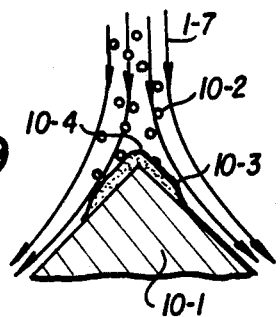
Figure 10:
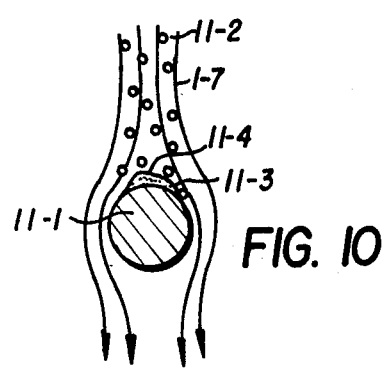
Figure 14:
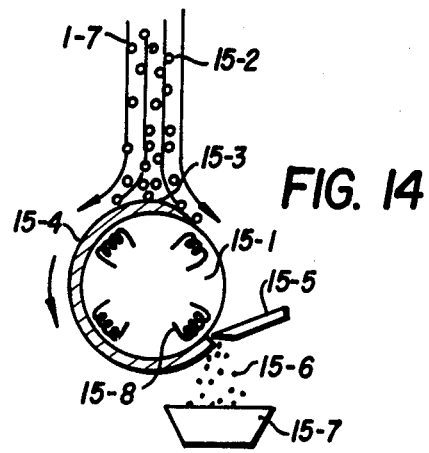
Figure 15:
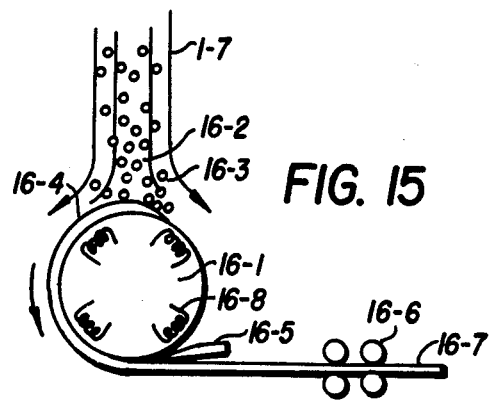
Figure 16:
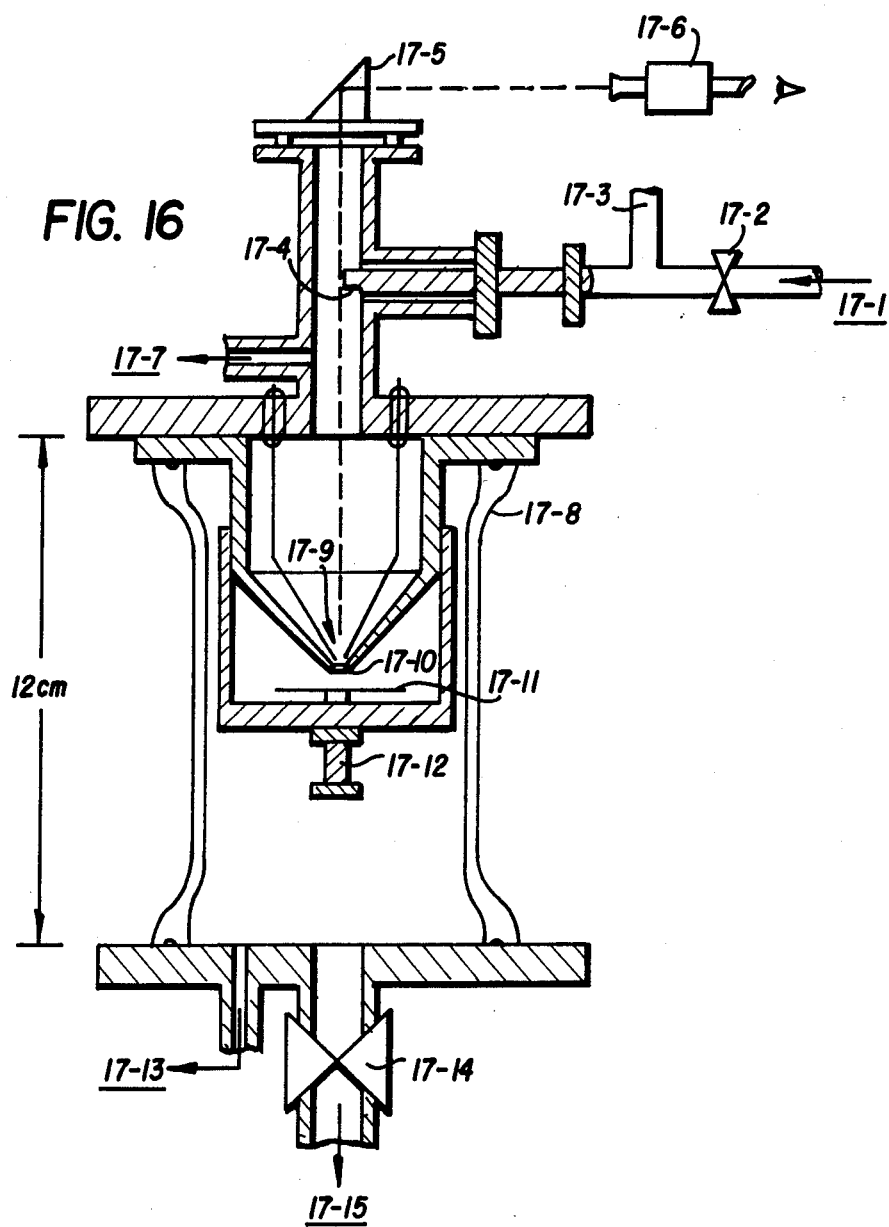
Figures 1, 17:
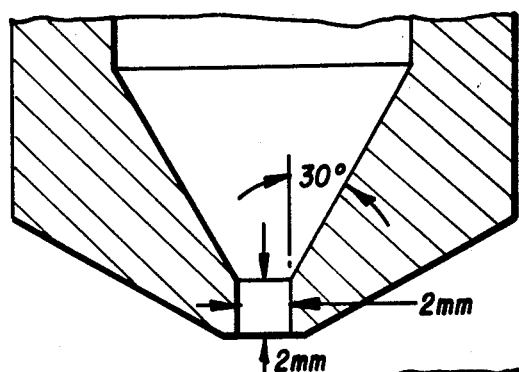
Figures 2, 17:
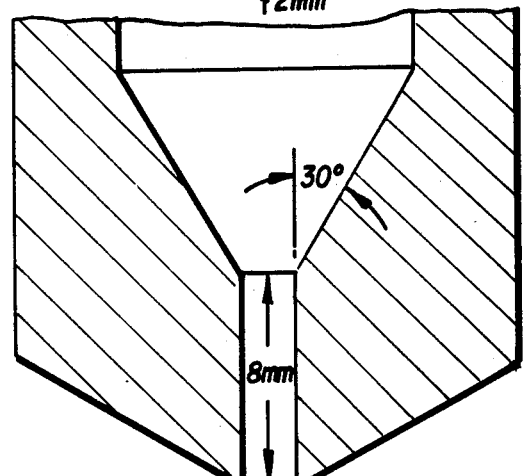

Before turning in detail to the drawings, since my invention departs so greatly from prior practices, I will describe some of the theory behind my invention. The modern theory of Physical Chemistry tells one that a chemical reaction is completely specified by the thermodynamic variables such as pressure, temperature, etc. which govern the molecular behavior of that reactions constituent chemical species, along with the specific reaction mechanisms and associated activation energies (which energies may be introduced by radiation, thermal conduction, etc.). Because this deposition technique affords great flexibility and control in specifying these variables, there is a large number of chemical reactions which potentially could be induced to occur by the following described method. The final product of such reactions is the desired useful phase of a solid in thin film form. This may be deposition on a substrate, where it remains, but also alternatly collected at a target area from which it can be removed (see FIGS. (15) and (16)). This alternate embodiment may be preferred in, say, powdered metallurgy uses.

Rather than trying to present an exhaustive list of all possible and anticipated useful reactions, the following summary will treat the general problem of depositing a thin film by the present technique, as embodied in my preferred embodiments in the three steps:

(1) Synthesis or formation of depositing vapor species
(2) Transport of said species from source to substrate
(3) Condensation of species and film growth.

Using the three steps of my process, the general problem of condensing a chemical species from the vapor phase into the form of a useful thin solid film, which coats the surface of a supporting solid material, may be solved with new results.

By the use of the high speed mass flux of an expanding inert gas as a carrier mechanism for transporting a dilute concentrate of a saturated metal-vapor species from the site where that species was synthesized to the object to be coated, where the condensation occurs, a thin solid film product may be formed (metallic or metal-compound). The advantages in using this system are manifold. Foremost is that the inert carrier gas transports the saturated metal-vapor quickly that there is no time for condensation to occur on anything except the object to be coated (i.e. unintentional depositions on the apparatus' chambers' walls are largely avoided). Thus nearly 100% of the synthesized depositing species is used in forming the thin film. Other advantages include the utilization of the full flexibility of gas-phase chemistry for formation of the depositing species; the system allows high depositing rates; the mechanism is continuously self purging; and it affords independent control of the quench rate. The last advantage arises because the substrate temperature during condensation can be varied at will.

A preferred embodiment of an apparatus useful for my inventions is depicted in FIG. (1). There is shown a nozzle 1-1, a chamber 1-2 downstream of the nozzle 1-1 termed herein the deposition chamber. An inert flowing gas shown as streamlines 1-3 acts as a carrier fluid. A mechanical pump 1-4 induces a steady flow of the carrier gas 1-3 from the supply 1-5 through the inlet 1-6 and nozzle 1-1. The fast moving gas flowing through the nozzle 1-1 enters the deposition chamber 1-2 and forms a jet 1-7. It is this jet 1-7 which impinges on the substrate 1-10 that achieves the transport of the depositing species (not depicted). The depositing species may be synthesized in the region R1 of the flow field, which extends from just upstream of the nozzle throat, through the throat region, (see FIG. (3)) and extends the length of the jet. The deposition occurs in region R2 which borders the surface of the substrate. Finally, the gas exits via outlet 1-8 and is exhausted, or if desired the carrier gas 1-3 may be recirculated via a recirculation loop 1-9. The substrate 1-10 is prepositioned in the deposition chamber 1-2, on which the product thin film 1-11 is deposited. A transport mechanism 1-12 moves the substrate 1-10 past the nozzle 1-1 and through the jet 1-7. An alternate embodiment, which may be preferred, would include a mechanism causing the nozzle 1-1, and therefore the jet 1-7, to move relative to a stationary substrate 1-10. The jet 1-7 is caused to be moved relative to the substrate 1-10 in order to coat a larger area of its surface, as amplified in FIG. (11). A mechanism 1-13 heats and/or cools the substrate 1-10 during the deposition in order to facilitate the fabrication of the thin film 1-11. Also a mechanism 1-14 heats or cools the carrier gas 1-3 in order to facilitate the transport of the depositing species, and to optimize the thermodynamic conditions governing the synthesis and condensation reactions. A port 1-15 allows access to the deposition chamber 1-2 before and after the deposition process.

The flow geometry, flow speed and the carrier gas pressure can be arranged so that the synthesis of the depositing saturated vapor species occurs near the center of the forming jet and does not allow time for diffusion of those species to the walls of the apparatus which border region R1. This is amplified in FIG. (3) which is a magnification of the beginning of the flow region R1. In FIG. (3), the saturated species 3-2 originates at some source 3-3 centered in the flow field of the inert carrier fluid, depicted as streamlines 1-3. The fast moving carrier fluid 1-3 convects the saturated species 3-2 past the nozzle's 1-1 (see FIG. (1)) throat's walls 3-1, before that species has time to diffuse to them. In this manner, unwanted condensation on the throat's walls 3-1 is avoided. The depositing species 3-2 is transported beyond the nozzle exit 3-4 into the deposition chamber 1-2 (not depicted), and the flow now constitutes a free jet 1-7.

Referring again to FIG. (1), the flow speed of the jet 1-7 slows as it encounters the solid substrate 1-10 in flow region R2, and here the saturated vapor species migrates to the objects solid surface where they form a deposit. The inert carrier and any unreacted gaseous reaction precursor molecules flow downstream and are pumped out at the exit 1-8. If a gas mixture containing unreacted gaseous species is recirculated via the recirculation loop 1-9 then these reactants as well as the carrier gas are recovered for further use. Further amplifications of the general deposition process follow below.

FIG. (2) illustrates a specific example of the method, which is described now so as to give a concrete example that will illuminate the generalized discussion of the depostion method which follows below. All the features of the general apparatus of FIG. (1) are reproduced in FIG. (2) (which utilizes the same reference numbers as FIG. (1)), except the flow regions R1 and R2 are not demarcated. Also included are the additional specific elements necessary for deposition of a particular material: tungstic-oxide. A gas mixture, which originates in the supply 1-5 and contains dilute concentrations of oxygen 2-1 (open circles) in helium 1-3 (depicted as streamlines) enters through the inlet 1-6 and flows over the tungsten filament 2-2 (the large shaded circle which depicts the cross section of a solid tungsten cylinder oriented transverse to the plane of FIG. (2)). An electric current from a power supply (not shown) is passed through the tungsten filament 2-2 to resistively heat it to temperatures at which evaporation of tungstic-oxide occurs. The oxygen 2-1 in the flow reacts with the hot solid filament to form a surface oxide. This oxide evaporates due to the high temperature of the tungsten filament 2-1, and the tungsic-oxide vapor molecules 2-3 and 2-4 (schematically depicted as open circles and circle pairs with one open and one shaded) are entrained in the helium flowing around the filament. These saturated vapor molecules 2-3 and 2-4 (saturated because the helium stream is cool) are convected by the flow 1-3 downstream to the cool substrate 1-10 where they condense to form a tungstic-oxide deposit.

According to the invention, the thin solid film is produced in a process of which my various preferred steps are described below:

1. Synthesis of Depositing Species

This step may be achieved in several ways exploiting physical and/or chemical phenomena as described below. It wil be important to observe that in my process, all vapor species which will saturate at the prevailing gas temperature must be confined to region R1 of the flow field (see FIGS. (1) and (3)). This temperature may be varied over a wide range to avoid premature condensation of a given reactant species by employing the gas heating/cooling mechanism 1-14 of the apparatus depicted in FIG. (1)—but it is anticipated that for many reactions the gas need only be at room temperature. All experimental demonstrations were performed with unheated gases, but the only theoretical limit on the gas temperature is that it must be cool enough in the flow region R2 for condensation to occur in the desired manner. The important point is that once a saturated vapor species is formed in region R1, it must be transported so quickly that it does not have time to condense on the nozzle's walls. (See FIG. (3), and the text describing it.) Thus, the problem becomes one of delivering the reaction precursor molecules to the region R1 and inducing a reaction to occur which synthesizes the depositing species.

This delivery can be achieved in three distinct ways as illustrated in FIGS. (4), (5) and (6): (1) The precursor (or precursors as shown in FIG. (4) may be a vapor or gas species 14-1, which is in undersaturated in the gas-phase at the prevailing temperature of the carrier gas 1-3. Then it can be mixed into the carrier far upstream and introduced into region R1 along with the carrier's 1-3 flow through the nozzle 1-1, where the pecursor 4-1 is then acted upon to synthesize a condensible species. (A description of such actions follows shortly.) This mechanism may be employed to introduce metal-bearing gaseous molecules (say silane or an organo-metallic salt) which is then used to synthesize a depositing metal-vapor, or it may be used to introduce reactive gas (say oxygen or a halogen) which reacts with a metal vapor in the formation of a metal-compound deposit (say a metal-oxide). Or (2) as shown in FIG. (5) the precursor species may be in solid or liquid form as a material 5-1, (depicted as a large circle) which is held in place directly in the flow field of gas 1-3 through the nozzle 1-1 at region R1 and subsequently heated (by some means not depicted, e.g. resistive heating of the material itself, or through contact with a heated surface, or with a laser) to evaporate (or sublime) off molecules 5-2, which then become entrained in the carrier gas flow 1-3. Or (3) as shown in FIG. (6) the reactant species may be molecules 6-1 of a fluid injected via a thin tube 6-2 into the flow region R1, where they are entrained in the flow of the carrier gas 1-3 through the nozzle 1-1.

Each mechanism can be used multiply in the same apparatus, in order to introduce several species, i.e. there can be two or more reactants, premixed in the carrier fluid (mechanism 1); or several solid or liquid materials placed in the flow (mechanism 2); or several thin tubes exiting in the region R1, each transporting a different species (mechanism 3). All three methods may be used simultaneously to deliver two or more reactant species to region R1 to achieve synthesis of the depositing species. As a specific preferred embodiment illustrated by FIG. (2), tungstic-oxide thin films may be formed in a process utilizing delivery mechanisms 1 and 2.

The introduction by evaporation from a solid (mechanism 1) produces a solidifiable vapor species, and so no other actions are necessary to achieve deposition. The evaporated atoms may be simply transported by the jet to region R2 where they form a deposit on the substrate. The result would be analagous to that of other evaporation coating techniques in use today. In other applications, however, it may be desirable to cause these evaporated species to suffer further reactions in order to synthesize the desired depositing species.

A specific advantage of the process and apparatus of my invention is that any precursor species which has successfully been introduced as a component in mixture with the carrier gas may be acted upon further in order to synthesize a depositing species. This action may take the form of:

(1) Chemical reaction with another species
(2) Dissociation of the chemical species by pyrolysis at a heated solid surface
(3) Dissociation of a similar species by absorption of radiation (photochemistry).
(4) Dissociation due to interaction with a plasma or discharge (arc heating)
(5) A combination of these methods acting on one or more species introduced by one or more delivery mechanisms.

This wide variety of actions is possible in my invention, precisely because the transport of the highly reactive, saturated depositing species by a jet of carrier gas serves to spatially isolate the synthesis chemical reactions from the actual condensation reaction at the substrate surface. Thus the thermodynamic and gasdynamic flow conditions (as well as other conditions, e.g. radiation intensity) governing the behavior of the chemically reacting gas mixture may be varied widely on either end of the jet in order to independently optimize both the synthesis reaction and the condensation reaction. Naturally, the flow conditions at the beginning of the jet (site of initiation of depositing species synthesis reactions) are coupled to the conditions at the surface of the substrate at the end of the jet (site of condenstation reaction to form a network solid). But although this dependence is very complicated it may be controlled by altering the flow geometry, gas pressure, temperature, mixture concentration, etc. as described below.

Once the synthesis reaction is started, it may continue as the reactant species are transported in the jet. Indeed as the carrier gas expands through the nozzle, it converts its thermal energy into mechanical energy and cools. The expanding carrier gas also cools the reactants, and provides a "heat sink" for any exothermic reactions which may occur. These continuing reactions (including homogenous nucleation) will depend on the evolving themodynamic conditions of the flow as the gas mixture expands through the nozzle and forms the jet. The conditions are dependant on the expansion rate which is largely controlled by the nozzle geometry. (One of ordinary skill in the art reading this disclosure will perhaps have need of further background in the gas dynamic of nozzle flows. For this purpose, reference may be had to J. D. Anderson, Jr., *Modern Compressible Flow*, 1982 McGraw-Hill, New York or H. W. Liepmann and A. Roshko, *Elements of Gas-Dynamics*, 1957 J. Wiley, New York, which are specifically incorporated herein by reference.) A diverging section may be added to the nozzle (see FIG. (7)) to control the expansion rate before the flow exits the nozzle to form a free jet. Indeed the addition of a diverging section can change the nucleation rate by several orders of magnitude. (Again, for purposes of reference for those of ordinary skill in the art who may require further background in gas-phase nucleation of clusters in seeded molecular beams, the reader is referred to O. Abraham, et al, "Gasdynamics of Very Small Laval Nozzles", *Physics of Fluids* 224 (6), 1981 American Institue of Physics; and O. F. Hagena "Cluster Beams from Nozzle Sources", *Gasdynamics* vol. 4, 1974 Marcel Dekker, New York, which are specifically incorporated herein by reference.)

2. Transport of Depositing Species

Once the synthesis step is initiated (synthesis can continue while the reactants are being transported) the transport step is achieved always in the same manner. The high speed flow of the carrier gas entrains the depositing molecules and convects them into the flow region R2 (see FIG. (1)) which borders on the object to be coated. In certain respects, the flow field will be largely dominated by the behavior of the inert carrier fluid, since the reactant molecules are present in dilute concentration (of order 1 molar % or less). One can analyze the flow as if it were the just pur carrier fluid under the same flow conditions and then by examining the degree to which the molecules of the depositing species are "entrained" in the flow of the carrier gas. This becomes a question of whether the species being transported is in equilibrium with the carrier gas. As we shall see, this question of equilibrium (or disequilibrium) is also very important in determining the exact mechanism of deposition.

Differences in the mixtures flow field as compared to that of the pure carrier fluid under the same fluid dynamic conditions will be mainly due to the possible disparity in masses of the mixtures constituent molecules and also due to the energy addition or consumption caused by the synthesis reactions. If one chooses to use a carrier gas with an especially small molecular weight (e.g. hydrogen or helium) then most depositing species will have a molecular weight which is one or several orders of magnitude greater (e.g. many metal or metal-oxide radicals). The possibility of dimerization, trimerization and ultimately cluster nucleation will increase this mass disparity, and with significant clustering the distinction between considering the behavior of the depositing species as that of molecules or as aerosol particles becomes less precise. In any event, even if the depositing species is present as only about one percent of the mixtures component molecules, its mass, momentum and energy—as distinct from that of the carrier fluid—may be far from negligible. In fact, it was the study of the behavior of heavy molecules in the high speed flow of a light bath which, inspired the invention of this deposition technique.

Accordingly, it will be found profitable in the case of a disparate mass mixture to exploit the similarity with aerosols when trying to model the motion of the heavy species. Even when the depositing species is distinctly molecular, rather than aerosol, the inertial effects governing its behavior can be highly significant. (One of ordinary skill in the art reading this disclosure will perhaps have need of further background in the gasdynamics of disparate mass mixtures, and in particular velocity persistance effects. For this purpose reference may be had to: J. Fernandez de la Mora, "Inertial Nonequilibrium in Strongly Decelerated Gas Mixtures of Disparate Molecular Weights", *Physical Review* A 25 (2), 1982 The American Physical Society; or J. Fernandez de la Mora, "Simplified Kinetic Treatment of Heavy Molecule Velocity Persistance Effects; Application to Species Seperation", From *Rarified Gas Dynamics*, Vol. 74 of *Progress of Astronautics and Aeronautics*, 1981 American Institute of Aeronautics and Astronautics—both of which are incorporated herein by reference.) In our high speed flow regime, the heavy depositing species can be in a state of extreme disequilibrium with the carrier fluid, so the conventional theory of continuum mechanics is not always applicable. However, since the heavy depositing species represents such a small fraction of the mixture's molecules, the mixture's flow can be treated as outlined previously: first observe or estimate from theory the flow field of the pure carrier gas, then determine the degree to which the heavy molecules "lag" behind the flow of the carrier.

The presence of the depositing species in dilute concentration will not hinder the flow of the carrier significantly, so the carrier flow field can be treated in the conventional manner. Such a treatment wil result in the gasdynamic knowledge of the jet of the carrier fluid which completely depends on the following parameters:

(1) Initial (stagnation) pressure
(2) Initial (stagnation) temperature
(3) Nozzle Geometry
(4) Ratio between the initial and downstream pressures (from nozzle exit)
(5) Gas viscosity
(6) Ratio of the carrier gas' specific heats, one at constant pressure, the other at constant volume.

As result of my described process and apparatus, it will now be recognized that for a given choice of carrier gas and depositing species, parameters 1, 2, 3 and 4 can be independently varied, radically altering the flow field, which in turn will alter the transport and deposition.

The motion of the depositing species will depend completely on the Mach Number (nondimensional speed) of the carrier flow field and the Stokes Number; this latter parameter will be a measure of the "lag" of the heavy depositing molecules behind the flow of the carrier fluid. Such lagging is often termed "velocity persistance" or "inertia" and describes departures from the motion of the molecules predicted by continuum mechanics. In this way, the Stokes Number represents the degree to which the heavy depositing species is in dynamical disequilibrium with the carrier bath. Thus with the knowledge of the carrier gas flow field, which is easily determined through well established theory, and an accurate estimation of the velocity lag of the depositing species in that flow field one can determine and control the transport of the depositing species.

Now the general representation of the flow velocity is the Mach Number (M), a nondimensional gasdynamic parameter which is defined as the ratio of magnitude of the flow velocity (U) to the gas' thermal speed (C)

$$M = U/C \tag{1}$$

We consider now the steady state of deposition, in which the flow regime, synthesis and deposition reactions are established, and continue unchanged until the desired, thin film thickness is achieved. In steady state, the flow field remains constant through time, and this simplifies the theoretical treatment. For the given geometry the flow field is then calculated assuming that the carrier gas is pure and employing conventional continuum mechanics. Depending on the application, the optimal flow field may be subsonic or supersonic. For any gas flowing through a nozzle at fairly large Reynolds Number, a pressure ratio across the nozzle (i.e. the quantity $P_i/P_b$ where $P_i$ is the gas pressure upstream of the nozzle, and $P_b$ is the base pressure in the deposition chamber) of between unity (1) and approximately two (2) (for almost any gas) will correspond to subsonic flow whereas whereas pressure ratios greater than about two (2) will cause supersonic flow. Naturally, a larger pressure ratio requires greater pumping capacity to maintain the flow. (In experiments, the flow Mach Number has ranged from one-tenth (0.1) to about unity (1).) The carrier gas used most often has been helium which has a sound speed at room temperature of about a kilometer per second. Since the distance over which the depositing species was transported was at most a few centimeters, the transport obviously happens very quickly.)

With knowledge of the carrier gas' flow field, one can begin an estimation of the Stokes Number. To reiterate, the Stokes Number is a measure of the degree to which the molecules of the depositing species "lag" behind the high speed motion of the carrier gas molecules. For example, if a molecule to be deposited originates in a solid filament placed in region R1 of the flow field and is then evaporated off into the gas flow, it must be accelerated from a state in which it is essentially at rest to the speed of the surrounding gas flow. This acceleration takes a certain time, and the Stokes Number is, in a certain sense, a measure of that time.

The Stokes Number (S) is acutally a ratio of two times: (1) the microscopic particle relaxation time ($\tau$) and (2) the overall macroscopic acceleration time of the flow (t).

$$S = \tau/t \tag{2}$$

The relaxation time is the average time required for the molecules of the depositing species to achieve velocity equilibrium with the host fluid. Equilibrium in gases arises from collisions between their constituent molecules. For example if a molecule is moving at a velocity radically different from the mean velocity of all the other molecules in a gas (i.e. if it is in disequilibrium), collisions cause a transfer of energy and momentum between molecules, which serve to bring the velocity of the unusual molecule more in line with the mean flow velocity. It should be emphasized that the relaxation time is a statistical probability and only has meaning for a large number of molecules. Collisions between molecules of similar masses are very effective in transferring energy and momentum, so perhaps only one collision is necessary to relax a molecule in a gas of other molecules with equal mass. However the transfer of energy and momentum from a heavy particle to a light particle is relatively inefficient, hence many collisions are necessary to equilibrate a heavy molecule with a gas of lighter molecules. These collisions take time, of course, so the more collisions necessary, the greater the relaxation time ($\tau$).

Naturally, there are also collisions between the molecules of the depositing species but since their concentration in mixture is so small, their number density is very small, so collisions are much less frequent. (In fact, in the absence of the carrier molecules, the densities of the depositing species would correspond to flow in the extremely rarified regime treated in hypersonic theory.) Actually the frequency of these self collisions of the depositing species will be important in determining the synthesis reaction, nucleation and, to a certain extent, the deposition rates, but for the present we are concerned with the degree to which the depositing species molecules achieve equilibration with the carrier gas. From statistical mechanics one can approximate the relaxation; time ($\tau$) through Einstein's formula:

$$\tau = m_d D/(k_B T) \tag{3}$$

where:
$m_d$ = Molecular weight of depositing species
D = Diffusion coefficient (depositing in carrier
$k_B$ = Boltzmann's constant
T = Absolute Temperature The diffusion coefficient can be measured in a standard experiment or it may be estimated using the Chapman-Enskog theory. (One of ordinary skill in the art on reading this disclosure may require a greater background in gas-phase mass transport theory. For this purpse, reference may be had to: D. E. Rosner, *Introduction to Energy, Mass and Momentum Transport in Chemically Reacting Fluids*, (in press) 1984 J. Wiley—EXXON, 1984 New York which is specifically incorporated herein by reference.) Thus, ($\tau$) is easily calculable from known quantities.

The other time which appears in the definition of the Stokes Number (Equation 2) is the fluid flow's macroscopic time of acceleration (t). To determine this time, one chooses a characteristic length of the flow geometry (d) (e.g. the nozzle throat diameter) and the average flow velocity (U) over that length. One obtains (t) from the following relation:

$$t = d/U \tag{4}$$

The choice of (d) is rather subjective, and so one must carefully choose the most relevant distance. Combining Equations 2, 3 and 4 we have:

$$S = m_d D U/(d k_B T) \tag{5}$$

or one may choose to exploit the perfect gas law to write this as:

$$S = m_d D U \rho/(d m_c P) \tag{6}$$

where:
$\rho$ = carrier gas density
$m_c$ = carrier gas molecular weight
P = gas pressure In an equilibrium situation, the Stokes Number is very small compared with unity, and this corresponds to the fact that in equilibrium, the molecular relaxation occurs much faster than the changes in the overall flow velocity. However, note that Equation 6 indicates that an increase in the ratio ($m_d/m_c$) of the depositing species to the carrier fluid's molecular weight will increase the Stokes Number. In fact, if this ratio is of order one hundred, it is possible to reach Stokes Numbers near unity even in subsonic flows. A Stokes Number near unity corresponds to conditions of extreme disequilibrium, where the inertia of the heavy species is so large as to dominate over the viscous forces of the carrier fluid. These inertial effects cause the depositing species to become disentrained from the flow of the accelerating carrier fluid and to pursue their own independent, ballistic-like trajectories. This inertial behavior is analogous to the behavior of macroscopic aerosol particles in disequilibrium with their carrier fluid. The novelty is in noting that such effects are also observable in massive molecules. To first order such effects account for behavior of heavy species normally attributed to "pressure diffusion".

Now with a knowledge of the carrier fluid flow field and the Stokes Number one can account for the transport of the depositing species. To achieve the transport, the condensing species must be entrained in the flow of the carrier; and to maximize this entrainment one must minimize the Stokes Number. Thus for a given depositing species this would imply a choice of carrier gas with similar molecular weight. However, as we shall see in the next subsection of this document which describes the deposition step, a regime of high Stokes Number may be desirable at the end of the transport step, so in certain applications it may be highly desirable to choose a carrier gas of much lower molecular mass to that of the depositing species.

The Mach Number (i.e. flow velocity), Stokes Number, and thus the transport will depend completely on the following parameters:
(1) Initial pressure
(2) Initial temperature
(3) Pressure ratio (across nozzle)
(4) Nozzle geometry
(5) Concentration of minority species
(6) Mass ratio (depositing to carrier species)
(7) Diffusion coefficient (depositing species in carrier)
(8) Carrier gas viscosity
(9) Specific heat ratio of carrier gas Again, when one employs my process for a given choice of depositing species and carrier fluid, parameter 1 through 5 can be varied independantly. As one of my preferred embodiments the Nozzle Geometry should be designed as described below so that even when one is using a disparate mass mixture the depositing species is efficiently entrained in the carrier fluid during acceleration. Such a disparate mass mixture, then allows one to employ inertial effects to achieve deposition (a description of this follows shortly). This nozzle design varies with the specific chemical application and is done using the Navier-Stokes fluid mechanics mathematical model as desribed below. A shematic is shown in FIG. (3) which is an enlargement of the throat section of the nozzle 1-1 in FIG. (1) in order to better depict the upstream portion of the flow region R1 in which the synthesis reactions occur. When a condensible species 3-2 is caused to be formed near the centerline of the flow 1-3 through the nozzle 1-1 (e.g. from evaporation off a filament 3-3 placed there), this species will begin to diffuse outward toward the solid walls 3-1 of the nozzle 1-1, but it will also experience collisions with the molecules of the flowing carrier gas 1-3 which will convect it downstream. The enclosed area depicts the region R1 populated by the condensible species 3-2 as they diffuse outward form the incipient jet's 1-7 axis while being transported downstream. Optimal circumstances (as dipicted) are such that the condensible species is convected past the nozzle exit 3-4 before diffusion to the nozzle's throat's walls 3-1 can occur, so condensation on the nozzle 1-1 itself is avoided. The advantage in placing the filament 3-3 upstream from the nozzle throat is that the depositing species is accelerated along with the carrier bath, so the entrainment is enhanced. Other geometries with differing transport properties are possible.

In practice, as described below successful transport of a given species may be achieved over a wide range of flow rates (i.e. pressure ratios $P_i/P_b$), so this allows variation of the thermodynamic and gasdynamic conditions within this range to optimize the synthesis reactions. Observe that Equation 6 implies that increasing the carrier pressure reduces the Stokes Number and thereby increases the entrainment rate. If all else remains constant, then by increasing the pressure ratio, one will increase the flow rate, and thus the transport rate. Furthermore, by adjusting the position at which the synthesis reaction begins (e.g. by changing the placement of the filament in evaporation) and/or by changing the placement of the object to be coated, one can control the overall residence time of the depositing species in the gas-phase of the jet. This control of the residence time along with the wide latitude in setting the concentrations can be used to govern the synthesis reactions. Also one can merely change the concentrations of the reacting species in order to alter the synthesis reactions. Naturally, for a given depositing species, one is free to choose any inert carrier fluid, which choice will depend on criteria peculiar to that application. These many degrees of freedom, afford great flexibility in designing an apparatus intended to cause a particular deposition to occur. Each envisioned application will require a systematic variation of these parameters to find the optimal configuration.

The the analysis of the transport process is complicated by the very fact that the synthesis reactions may continue to occur during the transport. Consequently, as experiments have demonstrated a slight change in the apparatus' geometry can have a profound effect on the gas phase residence time of the reactants, which, in turn, will greatly alter the products of the reaction. The addition of a diverging section (see FIG. (7)) on the nozzle will afford control over the gas expansion rate, which is not available in the case of the free jet (as depicted in FIG. (1)). Such a section has been shown to change the nucleation rate of a seeded species by many orders of magnitude. Thus, a diverging section could provide another means of control over the synthesis reaction and the transport rates.

Unfortunately, it has been recognized in gasdynamics that theoretical and experimental determinations of the degree of clustering are very difficult. But often, if clustering is extensive, a particulate structure will persist in the morphology of the deposit. Whether this is desirable or not will depend on the given application (it would be in, say, the deposition of a catalytic material, since that catalysis may benefit from the increased surface area of a catalytic material with a particulate structure).

The important point is that this phenomenon may be controlled to a large degree. (A treatment of the means of control is given in below.) Thus, the synthesis and transport steps which as noted, can occur simultaneously—are achieved. They are the preliminary steps in the overall deposition reaction.

(3) Deposition and Film Growth.

Once the depositing species is synthesized and convected into the region R2 of the flow field, its molecules migrate to the substrates surface alternately or in relative combination through one of the following two mechanisms.

(1) Molecular Diffusion
(2) Inertial Impaction

Which mechanism dominates in an actual deposition will depend on the Stokes Number of the flow. As the gas mixture expands through the nozzle it forms a jet. When this jet encounters the object to be coated, which has been placed in the region R2 of the flow field (FIG. (1)), the gas flow will decelerate. There arises again a situation of changing flow velocity, and the possibility of "velocity persistence" for the depositing species if there is a significant mass disparity. This possibility will be specified by the Stokes Number.

The object to be coated (i.e. the substrate 1-10 of FIG. (1)) may be a "bluff body" or it may have a "sharp" edge. (Including "wedges", "cones" and "cylinders" of small diameter compared to the jet diameter.) The flow past such generally characterized bodies can be calculated on the basis of the documentation which is found in many texts on the theory of fluid dynamics for both the subsonic and supersonic cases. (One of ordinary skill in the art on reading this disclosure perhaps requires further background in the theory of fluid flow past solid bodies. For this purpose, reference may be had to: G. K. Batchelor, *An Introduction to Fluid Dynamics*, 1967 Cambridge University Press, Great Britain—which is specifically incorporated herein by reference.) The case of subsonic flow impinging on a bluff body will be treated first, and then the cases of the sharp edge and supersonic flow.

The jet impingment on a blunt body (see FIG. (8)) can be likened to the so called "stagnation point" flow and, in fact, the deposition will be concentrated around the stagnation point 9-4. If the object 9-1 has a breadth which is an order of magnitude larger than the jet 1-7 diameter—which is of course comparable to the nozzle 1-1 orifice diameter (see FIG. (1)) then it should be considered as a bluff planar body with breadth which is essentially infinitely large in comparison to the jet 1-7 width. Even if the object is not actually planar, the theory is still applicable as long as its shape has fairly small curvature in comparison to the jet's 1-7 width.

The jet 1-7 (depicted as streamlines) transports the depositing species near the surface of the substrate 9-1. When the Stokes Number is sufficiently small, that is if the jet's 1-7 speed is fairly slow or if the carrier fluid has a molecular weight comparable to that of the depositing species or if the pressure is high enough (see Equation 6), then continuum mechanics will reign; the mixture can be considered in equilibrium; and diffusion will dominate the deposition process. The jet 1-7 will convect the condensing species 9-2 near the substrate's 9-1 surface, and because the flow speed will then have slowed, there will be sufficient time for molecular diffusion to this surface. Since the depositing 9-2 species can condense on the surface, the substrate 9-1 will "capture" this species from the gas-phase and a solid deposit 9-3 will form. The substrate 9-1 acts like a mass "sink" for the condensing species 9-2—at least in the sense that said species is a gas-phase species. But since the depositing species is removed from the gas-phase, its concentration in the gas mixture is depleted in the portion of the flow field abutting the substrate 9-1 surface (this flow region is termed R2 in FIG. (1)). This, of course, causes a spatial concentration gradient which drives further gas-phase diffusion in the mixture of the depositing species toward the substrate 9-1 surface. This process continues as the gas flows along the "infinite" breadth of the "bluff body" substrate 9-1 and essentially all of the depositing species 9-2 condenses from the gas-phase. Thus, nearly all of the synthesized depositing species 9-2 condenses into thin film 9-3 form. The carrier gas exits the depostion chamber downstream, and convects along with it any of the reactant species remaining in the gas-phase which were not fully consumed in the synthesis reactions producing the condensible species. However, if the carrier gas is recirculated via the recirculation loop 1-9 (see FIG. (1)), then these reactant species are also recycled and they are reintroduced in the flow through the nozzle 1-1 and into the flow region R1 where they again have a chance of being consumed in the continuing synthesis reactions. So even when a specific preferred embodiment involves the fabrication of a thin film using a deposition process which includes a chemical synthesis reaction step that is only fractionally efficient in converting the gas-phase reaction precursors into the desired depositing species, there is still high efficiency in the use of materials because the unreacted gas-phase species can easily be recovered and recycled. Thus my invention of method and apparatus for depositing thin films is highly efficient in that it converts nearly all of the initial raw chemicals into the desired thin film material.

The alternate deposition mechanism occurs when the Stokes Number of the flow is large, but even when inertial impaction is the dominant mechanism, diffusion still insures that all of the depositing species condenses—even that small portion of the depositing species' molecular population with insufficient velocity to be inertially impacted. The treatment of inertial impaction will begin with a discussion of the most important aspect of this phenomenon as it affects the condensation reaction: the unusually high kinetic energies of the depositing species molecules in the case where there is significant disparity in the molecular masses (i.e. $m_d/m_c$ is large), and the flow speed is fast. This large energy can affect the chemical reactions at the substrate surface as the heavy species collides with the atoms of the surface. (One of ordinary skill in the art on reading this disclosure perhaps require further background in the field of surface impact chemistry. For this purpose, reference may be had to: M. S. Connolly, et al, "Activation of Chemical Reaction by Impact of Molecules on a Surface", *Journal of Physical Chemistry* 85 (3), 1981 American Chemical Society; or E. Kolodney, et al, "Collision Induced Dissociation of Molecular Iodine on Sapphire", *Journal of Chemical Physics* 79 (9), 1983 American Institute of Physics—which are both specificially incorporated herein by reference.) Consider the expansion of the carrier gas. Before the expansion begins, the carrier gas has enthalpy (H) given by:

$$H = k_B T_i \gamma/(\gamma-1) \quad (7)$$

where:

$\gamma \equiv$ specific heat ratio of carrier gas $k_B \equiv$ Boltzmann's constant $T_i \equiv$ Initial (stagnation) absolute temperature Since the factor $[\gamma/(\gamma-1)]$ dependes on the gas, but is always of order unity, the enthalpy is always of order $(k_B T_i)$. If the expansion occurs into a region that has been largely evacuated, this enthalpy will be mostly converted to kinetic energy of the light gas flow (K).

$$K \equiv (m_c/2) U^2 \approx H \quad (8)$$

where:

$m_c \equiv$ molecular weight of carrier $U \equiv$ Flow velocity

Provided the expansion has proceded at a rate slow enough so that the Stokes Number has remained low, the heavy molecules of the depositing species dispersed in the flow will be efficiently entrained and will therefore share this velocity (U) and have their own kinetic energy, $(K_d)$ which is defined as:

$$K_d \equiv (m_d/2) U^2 \approx (m_d/m_c) H \quad (9)$$

where: $m_d \equiv$ molecular mass of depositing species

As previously observed, the mass ratio can be of order 100, so the kinetic energy of the heavy species can be unusually high, much greater than its initial thermal energy. Even when the flow remains subsonic, such a heavy species may have a kinetic energy of several electron volts per molecule, provided the Mach Number is high (although less than 1) and the heavy molecules have been adequately entrained. When this mechanical energy of the depositing species is very large, its initial thermal energy may be an insignificant fraction of its total energy so the molecules can be highly monoenergenetic. (One of ordinary skill in the art on reading this disclosure may require further background in the flow energies of nozzle beams—particularly in the energy distribution among the population of heavy molecules seeded in the flow of a light gas. For this purpose, reference may be had to: J. B. Anderson, "Molecular Beams from Nozzle Sources", *Gasdynamics*, Vol. 4, 1974, Marcel Dekker, New York.) High velocity also means very high momentum for the heavy molecules; from this arises the inertial effects.

An important feature of the stagnation point is that the continuum flow actually has zero flow velocity there. Naturally, the gas cannot have a velocity perpendicular to the flat plate, directly at the flat plate, but also the gas' finite viscosity insures that there is no lateral flow of gas in the layer of fluid immediately next to the plate. This is the so called "no slip condition" for Newtonian fluids. These features imply that the flow in the immediate region of the stagnation point is very slow. Now as the depositing species is accelerated through the nozzle in high Mach Number flow, it will have a velocity comparable to the speed of sound of the carrier fluid which is of order one kilometer per second for light gases like helium or hydrogen at room temperature. When the jet then encounters the stagnation point region, the flow must decelerate to near zero velocity (zero at the solid surface). Obviously, regimes of extremely high deceleration can be set up in the flow field. If the Stokes Number is then large enough (since it is proportional to the acceleration), the viscous forces of the carrier fluid may not be adequately large to maintain the heavy molecules in the continuum regime. They become disentrained from the carrier's continuum flow and pursue independent trajectories, encountering the plate at finite velocities, where they impact to form the deposit. The behavior is analagous to the what has been called inertial impaction of aerosol particles (One of ordinary skill in the art may on reading this disclosure may require further background in the field of aerosol physics. For this purpose, reference may be had to: D. T. Shaw *Recent Developments in Aerôsol Science,* 1978 J. Wiley, New York—which is incorporated herein specifically by reference.)

The deposition process should be viewed as a hetrogeneous chemical reaction. As previously observed, when the depositing species is inertially impacted, its large amount of kinetic energy can play an important role in this condensation reaction. Indeed with supersonic flow velocities, a stable species can be caused to dissociate soley through the collision energy of impaction. A change in flow velocity can alter the energy of impaction, which in turn markedly affects the hetrogeneous reaction and the qualities of the thin film thereby produced. As stated previously, changes in the flow velocity and in the concentration (partial pressure) of the reactant species can affect the synthesis reactions; however, if one assumes that the identity of the depositing species remains constant, these parameters (through their governance of the rates at which the depositing species molecules are introduced at the substrate surface and the their kinetic energies) as well as the substrate temperature are the main variables governing the condensation chemical reaction. These variables can, of course, be controlled, and there is great latitude in setting them so it is possible that many useful deposition reactions, each of which would procede optimally at specific conditions within this wide range of possible conditions, could be induced to occur.

This theory can be extended to the case of sharp edged substrates. For a "wedge" or "cone" oriented so that its sharpe edge is directed into the flow of the jet 1-7, (see FIG. (9)) the stagnation point 10-4 will occur on that edge (even a very sharp edge is blunt on a molecular scale). Any inertial impaction will occur on or near the sharp edge only, however viscosity will slow the flow past the wedge's sides, so the deposition due to molecular diffusion will occur on these sides. The relative importance of each of these mechanisms will depend on the flow speed, identity of the carrier and depositing species, and the specific flow geometry.

In case of a "cylinder" or "sphere" (see FIG. (10)) with diameter smaller than the diameter of the jet 1-7, impaction will be the only mechanism at high speed, and will occur on the upstream surface where again there is a stagnation point 11-4; whereas at low speed diffusion will allow condensation on areas of the substrate 11-1 surfaces further downstream. However, since the substrate is of camparable size to the jet' 1-7 width, diffusion will not insure that all of the depositing species molecules 11-2 will encounter the substrate 11-1 and deposit. Some molecules 11-2 will "miss" and be convected downstream.

These concepts apply as well to the supersonic case. The highest heavy species kinetic energies can be achieved in this case, which can be of order ten electron volts per molecule. Such high energies are not possible with conventional Chemical Vapor Deposition, or Evaporative Coating Processes and they are achieved in a low vacuum environment in contrast to the high vacuums required of Sputtering, conventional Evaporative Coating and other deposition technologies. In the supersonic case, one must be aware that detached shocks will form before blunt objects placed in region R2 (see FIG. (1)) while attached shocks form on sharp edged objects. In the latter case, a heavy depositing species will be impacted with highest energy at the point of the shock attachment (the sharp edge itself), otherwise the flow is decelerated through the shock so the depositing species will lose some of its high free stream velocity. In the case of the detached shock, the best choice of characteristic length (d) for calculating the Stokes Number (see Equations 4 and 6) of the flow is the shock to object distance.

In summary, my preferred deposition process embodies the disclosed three steps:
 (1) Synthesis of depositing species
 (2) Transport of said species
 (3) Deposition and film growth The deposition process may be viewed as one long steady state, gas-phase chemical reaction which begins with the reaction that synthesizes the depositing species, and ends as that species forms a deposit in the condensation reaction. The latter reaction is heterogenous and results in the formation of a network solid with chemical bonding to the substrate surface. The means of controlling the evolving chemical reactions is now described.

A benefit of using the carrier fluid mechanism of transport is that dominant flow of the inert carrier serves to purge the apparatus of gas phase impurities; thus control of the deposition chamber atmosphere is achieved. Specifically, before deposition begins, the flow of the pure carrier fluid is established through the apparatus. Any unwanted species introduced into the interior of the vacuum system (while it may have been open to the ambient atmosphere) will be entrained in the carrier flow and convected out. Provided there are no leaks in the apparatus, the flow will be of the pure carrier fluid. (The flow is presumed to originate from a storage chamber charged with a supply of highly purified inert gas.) Next, the flow of the reactants is established and the deposition reaction initiated. In this manner, the identity of the species involved in the synthesis and deposition reactants is controlled.

Even if there are small leaks in the deposition chamber's walls, the carrier gas flows between the substrate and these walls and presents somewhat of a dynamic barrier which isolates the deposition reaction from these possible sources of impurities. In other words, the fast carrier gas flow convects the atmosphoric impurities (or impurities due to outgassing of the chamber's solid surfaces) downstream before there is time for them to diffuse across the flow to the substrate. (Naturally, this effect will be strongly dependent on the size and position of the leak in the system.) Furthermore, it is conceivable that the entire deposition could occur in a system with carrier gas pressure always higher than atmospheric pressure. Thus, any leaks would leak out. There are no fundamental theoretical reasons which would preclude this concept, however the enormous pumps needed to operate at such high pressures—and therefore such high mass flux—have not been available for use in a laboratory demonstration. (Naturally, in practice the economic costs of operating such pumps must balanced against the benefits of a high pressure process.) In any event, the predominant flow of inert carrier serves to purge the apparatus initially and to maintain a controlled atmosphere for deposition. Thus the only species present are the inert carrier and the reactant species. Their relative concentrations can be varied provided the total number density of the reactants remains small compared to that of the carrier. Depending on the degree to which they are in equilibrium with the carrier fluid, the reactants partial pressures and temperatures will be determined by the pressure and temperature of the carrier gas, which depend throughout the flow field on their initial values before the expansion ($P_i$ and $T_i$), on the nozzle's (variable) geometry, and on the flow pressure ratio ($P_i/P_b$, where $P_b$ is the background pressure in the deposition chamber). These parameters will control the velocity, pressure and temperature fields throughout the flow field (assuming neglible energy addition or consumption due to the synthesis reactions) and thus these latter thermodynamic conditions which govern the chemistry of the process can be manipulated to optimize the envisioned synthesis and condensation reactions. Anomalies due to disequilibrium in the gas mixture, or those caused by non-negligible energy transfer to or from the flow, can be estimated using the Stokes Number, along with other standard techniques employed in the theory of mass, and energy transport in chemically reacting fluid flows.

In a flowing chemically reacting fluid under steady state conditions, the eactions occur over distance; the time of the reaction is the time needed for the flow to convect the reactants over the distance and through the reaction. Thus the flow field not only determines the energetics of the reaction; the velocity field and apparatus' geometry (e.g. the nozzle to substrate distance, or length of the free jet.) will also determine the residence time of the reactant species in the gas-phase, and therefore the time of the reaction. More precisely, the concentration, self collision time, and residence time of the reactants will specify their probability of interaction. This probability along with the energy of this molecular interaction will determine the synthesis reactions. Both probability and energy can be largely controlled in this system through the following macroscopic variables.
 (1) choice of carrier gas
 (2) Apparatus Geometry
 (3) Mixture concentration
 (4) Mixture initial pressure
 (5) Mixture initial temperature
 (6) Base pressure in deposition chamber.

Through these variables the system affords control over the synthesis reaction. The optimal conditions will depend on each application.

The deposition reaction can also be largely controlled by setting the substrate temperature, and the energy of the depositing molecules. By controlling the substrate temperature, one can control the thrmal "history" of the thin film solid being formed. The rate of quench is extremely important in determining the properties of the product solid phase material. When the flowing carrier fluid and depositing species are in equilibrium, the energy of the depositing molecules as they encounter the substrate surface will be determined by the flow temperature, but in the case of extreme disequilibrium under which inertial impaction can occur, the depositing molecules may encounter the substrate with very large translational energy (as discussed previously), which will, of course, affect the deposition reaction.

As previously stated, the degree of disequilibrium can be represened by the Stokes Number. To calculate precisely the distance (d) over which the deceleration of the jet occurs before impaction—and which (d) appears in the Equation (6), defining the Stokes Number—one must solve the Navier—Stokes Equations governing the flow. This is a relatively complicated task. However, for many geometrys one could borrow from the developed theory of aerosol impactor design. (One of ordinary skill in the art on reading this disclosure may have need of further background in the field of aerosol impactors. For this purpose reference can be made to: K. Willeke, et al, "The Influence of Flow Entry and Collecting Surface on the Performance of Inertial Impactors", *Journal of Colloid and Interface Science* 53 (1), 1983 American Institute of Physics; and V. A. Marple, et al, "Impactor Design", *Atmospheric Environment* 10, 1976 Pergamon Press, Great Britain—which are both incorporated herein specifically by reference). Marple, et al, note that (d) should be equated with the hydraulic diameter of the free jet. (For a circular orifice, the hydraulic diameter is merely the orifice diameter, while for a rectangular orifice, the hydraulic diameter is one half of the orifice width.) This conclusion is only valid at high Reynolds Number flow and only if there is enough distance between the nozzle exit and the subtrate for a subsonic jet to develop. The latter condition is satisfied provided the that distance is greater than the nozzle orifice's characteristic width. Following the development in Marple's work one would employ the free jet velocity (U) as the velocity in Equation (6). (The velocity of the free jet can be calculated using the standard theory of continuum mechanics, assuming that the gas is only composed of the pure carrier fluid.) Here one must assume that a heavy species shares this velocity with the light gas, or in other words does not "lag".

For the heavy species to be in equilibrium within the free jet of light carrier, they must be efficiently entrained in the accelerating flow of the carrier through the nozzle. To insure this the nozzle must be designed to minimize the Stokes Number in the accelerating part of the flow. Rather than solving the complete Navier-Stokes Equations of the accelerating flow (as Willeke, et al and Marple, et al, have done) one can begin with the standard one dimensional approximation of the carrier flow through the nozzle. (Again see J. D. Anderson, Jr., *Modern Compressible Flow*, as cited previously.) One approximates the flow velocity as the component of the velocity along the axis of the nozzle, calling this the X-coordinate, while neglecting the other components. The flow velocity (U) is a scalar in this approximation and for a given mass flux will completely depend on the nozzle geometry. Specifically, the flow velocity (U) at a position (X) will be inversely proportional to the cross sectional area (A) of the nozzle duct through which the flow must pass at that position. This is a simple consequence of mass conservation and so (U) as a function of (X) will depend on (A) as a function of (X) (i.e. the velocity depends on the nozzle geometry). One can define a local Stokes Number:

$$S = \tau(dU/dX) \quad (10)$$

where: $dU/dX \equiv$ the spatial gradient of U.
And by requiring the accelerating part of the flow field to be one in which $dU/dX$ is minimized, the Stokes Number is also minimized. This will, in turn, establish (A) as a function of (X) thereby specifying the nozzle's geometry. (it must be remembered that only if $S << 1$, will the depositing species be in equilibrium and therefore adequately entrained.) In practice, one must compromise between minimizing the acceleration Stokes Number, and maximizing the deceleration Stokes Number to achieve inertial impaction of a species. Each application will have its own specific requirements. Of course, these requirements must also be balanced against optimizing the flow conditions to achieve proper synthesis of the depositing species. All of these variables will depend on the desired application.

In addition, each application will dictate the choice of nozzle geometry, and choice of substrate shape and material. All experimental demonstrates were performed with a conical nozzle, but for coating a broad area, a rectangular nozzle, (with one long dimension) may be employed. To coat a large area (see FIG. (11)), the substrate 12-1 may be moved through the jet 1-7. Although the condensation of the depositing species 12-2 is concentrated at the stagnation point 12-4, this point (or line in the case of a rectangular nozzle) is moved across the substrate's 12-1 surface, so that the deposition also occurs across the entire surface. The rate of motion will determine the thickness and evenness (discounting edge effects) of the thin film deposit 12-3 so produced.

In practice, the substrates may be coated in a "batch" mode (see FIG. (12)) in which the deposition chamber is "charged" with many individual substrates 13-2, before it is sealed from the atmosphere, and then a mechanism 13-1 positions each individual substrate 13-2 under the jet 1-7 to recieve its thin film coating 13-3 as the depositing species 13-4 is convected to it and condenses on it. Alternately, for rolled or coiled stock as substrate material, the deposition may occur in a "semi-continous" mode (see FIG. (13)), in which the deposition chamber is charged with a "spool" 14-2 of substrate material 14-1. This material 14-1 is continuously "unwound" and passed through the jet 1-7, and wound onto another "spool" 14-6 positioned to receive it. The substrate material 14-1 receives its thin film deposit 14-4 at the stagnation point 14-5 where the jet 1-7 impinges on it. At the stagnation point 14-5, the depositing species condenses. The final product is a roll or coil of coated material. The entire apparatus depicted in FIG. (13) is contained within the deposition chamber 1-2 of FIG. (1) (not depicted here), and is substituted for the generalized substrate 1-10 of FIG. (1).

True continuous deposition could be achieved if the deposition chamber were open to the atmosphere. This would require maintenance of the pressure in this chamber at slightly above the ambient pressure so that some carrier gas could flow out the open ports and insure that no atmospheric species could diffuse inward. A gas gating mechanism could maintain the control of the chamber atmosphere. Of course, if the deposition chamber is at about one atmosphere pressure, the carrier gas initial pressure must be comparatively higher. The substrates would then be placed into the deposition chamber through the gas gate, and removed through another. In practice, these added complications and cost of the lost carrier gas, as well as the degree of control needed over the deposition atmosphere, must be balanced against the need for continuous operation.

An alternate embodiment, which may be preferred, in say, powdered metallurgy applications is the mode of deposition depicted in FIG. (15). The rotating drum 15-1 is contained within the deposition chamber 1-2 (not depicted) of the general apparatus in FIG. (1). The drum 15-1 is substituted by the general substrate 1-10 in FIG. (1). As the drum 15-1 rotates, the portion of its surface alligned into the jet 1-7 changes, so the depositing species 15-2 condensing at the stagnation point 15-3 begin to coat the rotating drum's 15-1 surface with a thin film 15-4. At another point on the drum's 15-1 surface, is alligned the scraper 15-5, which scrapes the thin film deposit 15-4 off the rotating dum 15-1. The powder 15-6 thus formed is collected in the hopper 15-7. Also depicted are mechanisms 15-8 for heating and cooling the rotating drum's 15-1 surface in order to facilitate the deposition and powdering processes. After the hopper 15-7 is filled with powder, the deposition is complete and the deposition chamber is opened to remove the product hopper 15-7 of powder 15-6. This technique is highly useful for the controlled atmosphere evaporation and condensation of materials needed for production of ultra pure powders of the so-called "super alloys", which are later compacted into very critical parts such as helecopter rotor hubs, jet engine components, etc. Furthermore, the operation of my apparatus at the fairly high pressures that are allowable, would also facilitate merging the apparatus onto other high pressure devices for the controlled atmosphere handling and casting of powdered materials.

In an alternate embodiment similar to the alternate embodiment of FIG. (14), which would be the preferred embodiment for the production of sheet or ribbon material by removing the product thin film deposit from the substrate, a rotating drum 16-1 (see FIG. (15)) is placed in the deposition chamber 1-2 (not depicted, see FIG. (1)) in place of the substrate 1-10. The jet 1-7, carrying the depositing species 16-2, impinges on the drum 16-1, and the depositing species 16-2 condenses in the stagnation point region 16-3. As the drum 16-1 rotates its surface through the stagnation point 16-3, a thin film deposit 16-4 forms and coats the surface. At another point on the drum's 16-1 surface, a knife 16-5 is positioned to peel the thin film deposit 16-4 off the surface. The product ribbon or sheet material 16-7 is pulled off the surface with the mechanism 16-6. Elements 16-8 for heating and cooling the drum 16-1 surface to facilitate the deposition and peeling processes are depicted. An apparatus, such as the one depicted in FIG. (15) would be highly useful for the production of thin metal foils, often used in electronics applications. The since the drum 16-1 can be maintained at high or low temperatures, high temperature phases of metal alloys may be condensed and quenched into metastable phases at room temperature. In this manner the so called amorphous metals may be produced. The device depicted in FIG. (15), in fact, appears similar in certain respects to other rotating drum devices used to produce amorphous metal ribbons, but these devices quench the metal from a melt, whereas my method involves quenching from the vapor phase.

Two rotating drum devices are depicted in FIGS. (14) and (15), and are used in prefered embodiments designed specifically for the production of powdered materials and ribbon materials. These results could be obtained equally well with devices employing other "continuously" moving surfaces, say with a revolving disk, or a belt on spindles. Such simple alterations on the theme of continuous motion of a surface are each not depicted in a separate Figure, but rather are considered as depicted in FIGS. (14) and (15).

DESCRIPTION OF FURTHER SPECIFIC EXAMPLES

Several experiments, which are specific examples of my invention were performed to demonstrate the concept of gas jet deposition. The experimental apparatus is depicted in FIG. (16), whereas the exact dimensions of the conical nozzles' geometries appear in FIG. (17). The carrier gas, and in certain instances dilute concentrations of admixed reactant species, enters the apparatus at 17-1. Subsequently it flows through a needle valve 17-2, which controls the mass flux and then the flow is "choked" through a small orifice 17-4 (0.2 mm in diameter). The pressure upstream is measued at 17-3. A measurement of the pressure ($P_u$) upstream of the small orifice, is also an indirect measure of the mass flux, because the flow through the small orifice is maintained supersonic, and then the mass flux is given by:

$$\dot{m} = [2/(\gamma+1)]^{[\gamma/(\gamma-1)]}(\pi d_{so}^2 P_u/4)\sqrt{[p/(R_I T_u)]} \quad (11)$$

where:
$\gamma \equiv$ Specific heat ratio
$d_{so} \equiv$ Small orifice diameter
$P_u \equiv$ Pressure upstream (before expansion)
$T_u \equiv$ Temperature upstream
$R_I \equiv$ Ideal gas constant In this case, the upstream temperature ($T_u$) could be assumed room temperature. For a given gas and orifice, the mass flux is therefore dependent only on the upstream pressure ($P_u$). In experiments, the mass flux was approximately 5 milligrams per second.

After entering the nozzle 17-10 the gas flow over a tungsten filament 17-9 (wire, 0.2 mm in diameter, approx. 1 mm long) which is placed transverse to the flow, centered on the axis of the nozzle, and set within one nozzle diameter ($d_n = 2.0$ mm) of the entrance to the nozzle throat section (see FIG. (17)). This filament 17-9 is heated resistively, and is the source of the depositing species. The gas entrains these species, expands through the nozzle throat forming a jet that enters the deposition chamber 17-8 with speed (U) and finally impacts on a glass plate 17-11, which is positioned several nozzle diameters downstream of the nozzle exit. The flow from the deposition chamber 17-8 is removed by a mechanical pump positioned at 17-15 at the rate of 160 liters per minute.

The pressure upstream of the nozzle 17-10 could be measured at 17-1, whereas the base pressure in the deposition chamber 17-8 was measured at 17-13. A throttling valve 17-14 permits regulation of the jet Mach Number, which is calculated assuming an isentropic expansion (a good approximation at high Reynolds Number), by the following Equation:

$$M = \sqrt{<<[2/(\gamma-1)][(P_i/P_b)^{[(1-\gamma)/\gamma]}-1]>>} \quad (12)$$

where:
$P_i \equiv$ Initial pressure upstream of nozzle
$P_b \equiv$ Base pressure in deposition chamber All pressures were measured with either oil or mercury manometers, while the tungsten filament 17-9 temperature ($T_f$) was measured using an optical pyrometer 17-6

The Reynolds Number of the jet can be calculated from the mass flux, given in Equation (11), since conservation of mass through the entire system (in steady state) requires:

$$\dot{m} = \pi \rho U d_n^2 / 4 \tag{13}$$

where:
$\rho \equiv$ carrier gas density
$d_n \equiv$ Nozzle diameter
$U \equiv$ Jet velocity The definition of the Reynolds Number (R) of the jet is:

$$R \equiv \rho U d_n / \mu \tag{14}$$

where: $\mu \equiv$ carrier gas viscosity
Upon substitution of (13) into (14), $$R = 4\dot{m}/(\pi \mu d_n) \tag{15}$$

During operation the Reynold's Number was of order 100, which is actually not entirely large enough to satisfy the isentropic assumption behind the Mach Number calculation (Equation (12)). However, short of a numerical analysis, Equation 12 is the only means of estimating the Mach Number, and it should be fairly acurate at ($R \sim 100$).

These Equations for the Mach Number (M) (Equation 12) and the Reynolds Number (R) (eq. 14) are only valid for subsonic flow, and they neglect any energy addition by the hot filament. Also the specific heat ratio ($\gamma$) of the carrier gas only is used which neglects the presence of any reactants in mixture. Still, these Equations should yield highly accurate estimates of the basic properties of the flow field—within their range of validity.

The apparatus of FIG. (16) was used (with nozzle of geometry no. 1, in FIG. (17)) to deposit three species for three seperate demonstrations of the technique.

Experiment (1): A mixture of (0.5 molar %) silane in helium was flowed through the system. The upstream flow was maintained at pressure ($P_u \sim 400$ torr), while the filament was heated to temperature ($T_f \sim 2400$ C.). At this temperature the silane decomposed at the filament into various condensing silicon-hydride radicals and a deposit formed on the glass slide. Deposition occurred over a fairly wide range of Mach Number ($0.4 < M < 1$). The initial pressure ($P_i$)—pressure at the filament—before expansion was of order 1 torr, while the base pressure ($P_b$) in the deposition chamber was correspondingly less, as the pressure ratio ranged over: ($1.3 < P_i/P_b < 2$).

Since the molecular mass ratio of silane to helium is only about eight ($m_d/m_c \sim 8$), the dominant mechanism of deposition was surely diffusion, at these subsonic flow velocities ($M < 1$). The large pump needed to induce supersonic flow through this geometry was not available.

A nozzle with similar geometry, except that it had four times the throat length (see no. 2, FIG. (17)) was also tested. In this case, viscosity slowed the flow considerably and increased the residence time of the condensible species in the gas-phase. Significant nucleation of gas-phase clusters resulted and a particulate nature persisted in the morphology of the deposit. Indeed, a small change in apparatus geometry can have significant consequence for the quality of the deposit.

An infra-red spectral analysis of the amorphous hydrogenated silicon deposit, formed by the first means showed no trace of atmospheric impurities, thus demonstrating that the atmosphere during deposition was controlled.

Contaminant-free samples of hydrogenated amorphous-silicon in thin film form can display semiconducting properties. Furthermore, these materials may be doped to form homojunctions. Dopants often used are boron and phosphorus. In my method, the doping of the hydrogenated amorphous silicon can be achieved simply by premixing small concentrations (compared to the concentration of silane) of dopant bearing gases (e.g. phosphene or diborene) into the flowing gas mixture of silane and the inert carrier gas. These dopant bearing species will dissociate at the hot surface of the filament just as the silane does, and the dopants bearing radicals will then condense along with the silane and be incorporated in the amorphous-silicon solid. Such is one example of usefulness of the reactant introduction mechanism 1 depicted by FIG. (4), when it is being employed to introduce several differing reactant species.

Research has been reported in the literature, in which amorphous-silicon thin film materials alloyed with fluorine have been deposited in a plasma discharge apparatus from the gas-phase species, silicon-tetrafluoride. These materials display semiconducting properties as well. Silicon-tetrafluoride may be deposited in my apparatus, as well, in a process exactly as above, except that ($SiF_4$) is substituted for ($SiH_4$).

Experiment (2): A small amount ($\sim 1$ molar%) of oxygen in helium was flowed through the system from an upstream pressure ($P_u \sim 400$ torr). The tungsten filament was maintained at a temperature ($T_f \sim 1400$ C.) at which surface oxidation occurs. The flow of oxygen oxidized the surface of the tungsten, and the oxide evaporated from the filament, was entrained in the helium flow, and formed a deposit. Experiments were performed over a wide range of Mach Number ($0.1 < M < 1.0$) and therefore over a wide range of pressure ratios ($1 < P_i/P_b < 2$) to study the effect of inertia on the deposition. The pressures throughout the nozzle system were always of order 1 torr. At low velocity, the deposits were broad, implying that the tungstic-oxide molecules had time to diffuse radially in the jet. A high velocity, however, the opposite was true; the molecules were inertially impacted and concentrated near the stagnation point.

Thus is demonstrated a fairly general method of depositing metal-oxide thin film coatings (such as with the apparatus of FIG. (2)). Of course, such insulating thin film layers made from metal-oxides (e.g. aluminum-oxide, or magnesium-oxide) are highly useful as parts of electronic devices. Certain oxides can have useful conducting properties as well (e.g. ITO, $MbSnO_4$ or $SnO_2$(Sb doped)).

Silicon-oxide thin films are also used as constituents in electronic devices. This species can be codeposited with glass forming dopants or crystal forming dopant (depending on the final application). One method would be to premix silane gas into the stream of inert carrier gas upstream of the nozzle (introductory method 1, see FIG. (4)). Dopant bearing species (e.g. diborene) could also be premixed in the inert carrier-silane mixture in the the concentration chosen so that the thin film deposit has the desired dopant concentration. In flow region R1, oxygen can be introduced via a separate thin tube (delivery mechanism 3, see FIG. (6)). The silane and dopant bearing species will oxidize and the resulting silicon-oxide and small concentrations of dopant-oxide (along with residual hydrogen atoms) will condense to form a deposit at the stagnation point on the substrate. Subsequent annealing can be employed to drive off any unwanted hydrogen. An alternate mechanism involves the evaporation of silicon atoms from solid silicon (delivery mechanism 2, see FIG. (5)) into the inert carrier into which oxygen molecules have previously been seeded (delivery mechanism 1 see FIG. (4)). This process of silicon-oxide deposition is similar to the aluminum-oxide deposition depicted in FIG. (2). The process will be useful in the coating of glass optical fibers, and can have other applications in the deposition of useful glass thin films.

It is recognized that metal-oxides coating are also useful for their effectiveness in providing chemical protection for the supporting substrate material at elevated temperatures. Powdered metal-oxide also can be useful in ceramics.

In alternate applications, other species (e.g. nitrogen, chlorine) may be substituted as the gas-phase oxidizing species premixed in the flow of the inert carrier, which oxidizes the heated metal. For example, titanium may be the evaporated metal atoms which oxidize with nitrogen molecules admixed in the inert gas flow. In this manner titanium-nitride coatings could be formed on substrate surfaces. Titanium-nitride thin films are valued for their extreme hardness, and so if the substrate were, say, a cutting tool, then the titanium-nitride deposit would serve as a tool coating material.

In other specific applications involving the production of metal-oxide deposits, rather than evaporating the metal atoms from a pure solid metal sample (the reactant species introduction mechanism 2 depicted in FIG. (5)), the metal atoms would first be introduced as part of a chemical species (e.g. a metal-carbonyl) which has a fairly high vapor pressure at normal (i.e. around room) temperatures. Thus, such a species could easily be premixed in the inert carrier fluid (introduction mechanism 1 depicted in FIG. (4)), while the oxidizing species would be introduced via a thin tube into the reaction region R1 (see FIG. (1)) of the flow field (delivery mechanism 3 depicted in FIG. (6)). In this manner, the oxidation reaction would occur in the flow region R1 thus producing a condensible metal-oxide radical to be deposited on the prepared substrate in the usual manner.

Experiment (3): Starting from upstream pressure ($P_u \sim 400$ torr), pure helium was flowed through the system, and over a gold foil that was wrapped around the tungsten filament. The filament was heated to temperatures at which gold atoms evaporated; these were transported by the jet, and deposited. Again deposition could be induced to procede over a wide range of Mach Number ($0.1 < M < 1$). Again the initial and base pressures were of order 1 torr. Thus is demonstrated a general method for the deposition of thin solid metal films. Since the metal atoms are introduced into the gas-phase by delivery mechanism 2 (depicted in FIG. (5)), the metal material in the flow region R1 (see FIG. (1)) is heated to elevated temperatures, yet the substrate in region R2 can remain cool. This would allow the fabrication of solid metal thin film coatings on materials (e.g. plastic, paper, etc.) which cannot sustain high temperatures. Such a metal film could have application as a conducting layer in an electronic device. Also, catalyst materials (e.g. platinum) can be deposited in thin film form in a like manner.

The evaporative coating of metals could be employed in conjunction with the apparatus depicted in FIG. (15) to produce metal foils. The high quench rates affordable by my method makes possible the condensation and production of amorphous metal ribbons, which materials can have unusually high strength due to their lack of the line defects of a crystal lattice.

Several metals can be evaporated simultaneously, from several pure metal solid metal samples, each placed and heated in the region R1 of the flow field (multiple use of delivery mechanism 2, see FIGS. (1) and (5)). In this manner metal alloys may be produced. For example, titanium-nickel, or aluminum-nickel alloy thin film deposits (usually produced by cosputtering) can be produced. These thin film materials, when alloyed properly with a small concentration of a ternary element (usually a rare-earth metal), can display large capacity for the chemisorption of hydrogen. Using such a material as a hydrogen storage system can have application in battery and fuel cell technology.

Chromiun-cobalt compounds in thin film coating form have recently found application in electronic information storage technology, as a material used in computer disk memory devices.

Organic molecules as well may be deposited to form coatings. Organic materials in bulk solid form (e.g. anthracene) may be heated to evaporate the long chain molecules into the gas-phase, so they may be convected by the inert carrier gas flow (see FIG. (5)). The substrate may be heated or cooled during deposition to encourage or suppress further polymerization and cross-linking of the long chain molecules that have condensed onto the substrates surface. Alternately, monomers may be synthesized in the gas phase and then allowed to polymerize during their transport in the jet to the substrate, where they condense. The constituent reactants of such gas-phase synthesis reactions may be introduced into the flow via the mechanism illustrated in FIGS. (4) and (6). Polymeric coatings can have useful insulating properties; they are used as chemical protective coatings, and certain polymers are known to have conducting and semiconducting properties.

These three demonstrations indicate the general method which is employed to make many various thin solid film materials. These films may be either conducting, semiconducting or insulating, but their uses are not limited to exploiting their electronic properties.

As will be seen, I have disclosed a method and apparatus with which can be deposited conductors and dielectrics as products such as solid layers or thin film (and then, if desired, further processed to power) composed of the following chemical species: silicon, gold, tungsten, aluminum, magnesium, iron, carbon, chromium, cobalt, platinum, titanium, germanium and other metals; solid phases of oxides, nitrides, hydrides, fluorides, and other compounds containing an oxidizing agent; including mixtures and alloys and compounds thereof in either crystal, polycrystal or amorphous phase. In addition the product can be an organic solid or a polymer. Additional understanding of the inventions disclosed will be found upon a reading of the claims of this disclosure.

What is claimed is:

1. A method of depositing a condensible gaseous material entrained in an inert carrier gas as a solid onto a substrate surface unreactive to the condensible gaseous material comprising:
    (a) forming a stream of inert carrier gas;
    (b) generating the condensible gaseous component to be deposited on the substrate substantially contiguous to or within a means for forming a jet of the inert carrier gas;

(c) transporting the condensible gaseous material and the stream of the inert carrier gas through the jet forming means toward the substrate;

(d) decelerating the jet stream of inert carrier gas by impinging the jet against the substrate and thereby effecting a deposit in solid form of the condensible gaseous material; and (e) effecting relative movement having a lateral component between the substrate surface and the stream of inert carrier gas to dispose a substantially uniform thickness of solid condensible gaseous material on the substrate surface.

2. The method of claim 1, and wherein the flow of inert carrier gas is effected through a mechanical pump means.

3. The process of claim 1 and further wherein step (e) is carried out while impinging the jet stream on the substrate surface.

4. The method of claim 1, wherein the condensible gaseous material is a metal.

5. A method according to claim 2 in which the gas atmosphere in the deposition system is controlled by the flow of inert carrier gas which purges the flow system.

6. A method according to claim 2 in which the flow of the fluid mixture is recirculated in to the deposition system gas inlet via a recirculation tube.

7. A method according to claim 2 wherein the population of condensible molecules of said deposition species is substantially maintained within a flow region which insures that the molecules are far enough downstream in a flow of inert gas which transports said species so that a saturated condensible vapor of the depositing species will be convected past nozzle surfaces, which are provided to direct said gas, before the molecules have time to diffuse to and condense on said surfaces.

8. A method according to claim 1 in which molecules of one or more reaction precursor species destined for consumption in an evolving synthesis reaction occuring in flow region are premixed with a carrier gas as an undersaturated vapor before depositing species synthesis.

9. A method according to claim 8 in which the species destined to be consumed in the evolving synthesis reactions is initially in solid or liquid phase bulk form, which is then heated until its vapor pressure rises so that the desired mass flux of reactant species is evaporated off into inert gas.

10. A method according to claim 9 in which more than one reactant species is evaporated from more than one solid or liquid bulk material sources, into the gas flow region.

11. A method according to claim 8 in which the chemical species destined for consumption in the evolving chemical symthesis reactions is a fluid which is delivered via a thin tube duct that exits into the gas flow region to be entrained in a stream flow field thereof.

12. A method according to claim 1 wherein any species so introduced into the gas flow can participate in chemical synthesis reactions (including gas phase nucleation) which are controlled by the design of a nozzle's geometry—which directly affects the flow conditions which govern the energies and trajectories of the reactant species.

13. A method according to claim 1 wherein synthesis reactions (including dissociation) are activated by energy addition to the molecules by energy means of either:

(1) heating at hot solid surface, or
(2) absorption of radiation, or
(3) any combination of said energy means,
(4) any combination of said energy means.

14. A method according to claim 1 which the production of overlay coatings on a supporting substrate is done in batch mode.

15. A method according to claim 1 in which the production of thin film overlay coatings on supporting substrate material is done in continuous mode through the use of gas gating means.

16. A method according to claim 1 in which deposited layers of coatings with differing materials is formed by the use of one or more nozzles to deposit one and then the next layer.

17. A method according to claim 1 which deposits a product film composed of the following chemical species: silicon, gold, tungsten, aluminum, magnesium, iron, carbon, chromium, cobalt, platinum, titanium and germanium; solid phases of oxides, nitrides, hydrides, fluorides, and other compounds containing an oxidizing agent; or combination thereof, including mixtures and alloys and compounds thereof in either crystal, polycrystal or amorphous phase.

18. A method according to claim 1 wherein the depositing species is introduced within an accelerating flow of the carrier gas jet continuum traveling at a speed sufficent to entrain the species, and the flow is regulated so as to define a local Stokes Number so as to achieve inertial impaction of a species to be deposited after the carrier gas jet leaves the orifice.

19. A method according to claim 1 wherein the flow of the gas jet continuum is regulated by a throttle to change the Stokes Number to define a local Stokes number so as to control the location of the said transition zone and the type of deposition which is to occur in the target area region.

20. A method according to claim 1 wherein the synthesis reaction precursor species is entrained in a flow field of the gas jet continuum where decomposition or reaction with other species so entrained form a species to be deposited in the form of saturated condensible vapor which condenses from the gas jet continuum in said second region.

21. A method according to claim 1 wherein a saturated condensible vapor of the depositing species is confined within the flow field region of the gas jet continuum and transported downstream so quickly that substantially no migration from the gas occurs until the saturated condensible vapor reaches the second region adjacent to a target surface.

22. A method according to claim 1 wherein within a flow field defining aerodynamic confinment within a field of said gas jet continuum reactions occur which complete formation of the depositing species before the gas jet reaches the target substrate.

23. A method according to claim 1 wherein the gas jet continuum efficiently entrains and accelerate vapor molecules so as to cause inertial impaction of the vapor molecules onto the substrate.

24. A method according to claim 1 wherein the gas jet continuum flows at a rate in excess of 0.1 Mach.

25. A method according to claim 1 wherein the gas jet continuum flows at a rate in excess of 0.4 Mach.

26. A method according to claim 1 wherein the gas jet continuum flows at a rate of Mach 1 or greater.

27. A method according to claim 1 wherein the synthesis and formation as a condensible vapor of the depositing species is isolated in the flow field of the gas jet continuum from the condensation through diffusion or inertial impaction of the condensible vapor which occurs in the second region at the target area.

28. A method according to claim 1 wherein the gas jet continuum fluid of inert gas is recirculated after reaching the second region and after the depositing species are disentrained on the target substrate as an inert gas substantially free of an entrained depositing species.

* * * * *